(12) United States Patent
Hwang et al.

(10) Patent No.: US 10,964,747 B2
(45) Date of Patent: Mar. 30, 2021

(54) HIGH RESOLUTION DISPLAY DEVICE

(71) Applicant: SAMSUNG ELECTRONICS CO., LTD., Suwon-si (KR)

(72) Inventors: Kyungwook Hwang, Hwaseong-si (KR); Junhee Choi, Seongnam-si (KR); Junghun Park, Yongin-si (KR); Joohun Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/994,201

(22) Filed: Aug. 14, 2020

(65) Prior Publication Data

US 2020/0381475 A1 Dec. 3, 2020

Related U.S. Application Data

(63) Continuation of application No. 16/183,953, filed on Nov. 8, 2018, now Pat. No. 10,784,309.

(30) Foreign Application Priority Data

Nov. 9, 2017 (KR) .................. 10-2017-0148717

(51) Int. Cl.

| | |
|---|---|
| *H01L 27/15* | (2006.01) |
| *H01L 27/12* | (2006.01) |
| *H01L 33/42* | (2010.01) |
| *H01L 33/06* | (2010.01) |
| *H01L 33/50* | (2010.01) |

(Continued)

(52) U.S. Cl.
CPC ........ *H01L 27/156* (2013.01); *H01L 25/0753* (2013.01); *H01L 27/124* (2013.01); *H01L 33/06* (2013.01); *H01L 33/32* (2013.01); *H01L 33/42* (2013.01); *H01L 33/505* (2013.01); *H01L 33/507* (2013.01); *H01L 33/145* (2013.01); *H01L 33/20* (2013.01); *H01L 33/382* (2013.01);

(Continued)

(58) Field of Classification Search
CPC combination set(s) only.
See application file for complete search history.

(56) References Cited

U.S. PATENT DOCUMENTS

| | | | |
|---|---|---|---|
| 2004/0051110 | A1 | 3/2004 | Oohata |
| 2006/0175621 | A1 | 8/2006 | Ohtsuka et al. |

(Continued)

FOREIGN PATENT DOCUMENTS

| | | | |
|---|---|---|---|
| EP | 2187442 | A2 | 5/2010 |
| EP | 2999014 | A1 | 3/2016 |

(Continued)

OTHER PUBLICATIONS

Communication dated Feb. 5, 2019, from the European Patent Office in counterpart European Application No. 18204133.5.

*Primary Examiner* — Nduka E Ojeh
(74) *Attorney, Agent, or Firm* — Sughrue Mion, PLLC

(57) ABSTRACT

A display device is provided. The display device includes a substrate, an emission layer configured to emit light, the emission layer including a first semiconductor layer provided on the substrate, an active layer provided on the first semiconductor layer, and a second semiconductor layer provided on the active layer, and a plurality of color converting layers provided on the emission layer and configured to emit light of certain colors from light emitted from the emission layer.

16 Claims, 19 Drawing Sheets

(51) Int. Cl.
 *H01L 33/32* (2010.01)
 *H01L 25/075* (2006.01)
 *H01L 33/38* (2010.01)
 *H01L 33/20* (2010.01)
 *H01L 33/14* (2010.01)
 *H01L 33/46* (2010.01)
 *H01L 33/58* (2010.01)

(52) U.S. Cl.
 CPC ............ *H01L 33/387* (2013.01); *H01L 33/46* (2013.01); *H01L 33/58* (2013.01)

(56) References Cited

U.S. PATENT DOCUMENTS

| | | | |
|---|---|---|---|
| 2010/0079704 A1* | 4/2010 | Cho | G02F 1/133617 349/71 |
| 2015/0333115 A1* | 11/2015 | Yang | H01L 27/3272 257/40 |
| 2015/0362165 A1 | 12/2015 | Chu | |
| 2017/0125640 A1* | 5/2017 | Kim | H01L 33/38 |
| 2017/0179092 A1 | 6/2017 | Sasaki et al. | |
| 2017/0309798 A1 | 10/2017 | Bonar et al. | |
| 2018/0012949 A1* | 1/2018 | Takeya | H01L 51/5203 |
| 2018/0090639 A1* | 3/2018 | Ting | H01L 33/08 |
| 2018/0151804 A1* | 5/2018 | Chaji | H01L 27/326 |
| 2018/0277524 A1 | 9/2018 | Moon | |
| 2019/0165035 A1 | 5/2019 | Fu | |
| 2019/0288049 A1 | 9/2019 | Takeya | |
| 2019/0386250 A1* | 12/2019 | Suzuki | G02B 5/124 |

FOREIGN PATENT DOCUMENTS

| | | |
|---|---|---|
| JP | 5719110 B2 | 5/2015 |
| KR | 10-2013-0138483 A | 12/2013 |
| KR | 10-1524726 B1 | 6/2015 |
| KR | 10-2017-0022756 A | 3/2017 |
| KR | 10-2017-0084139 A | 7/2017 |

* cited by examiner

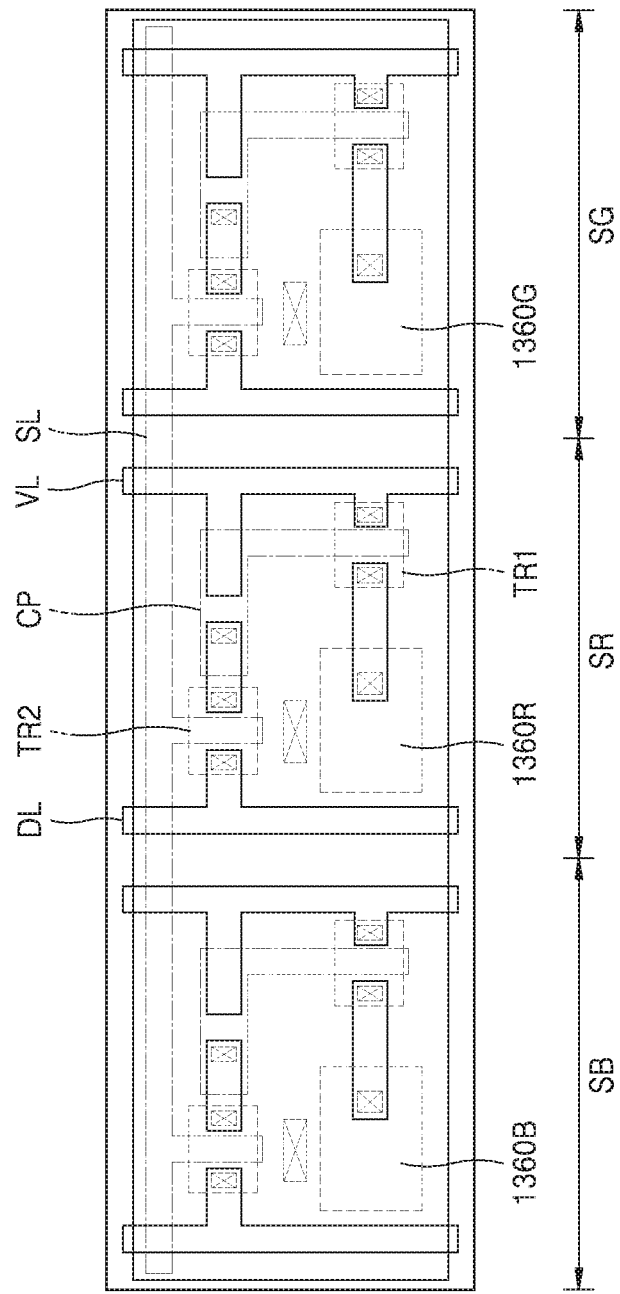

HIGH RESOLUTION DISPLAY DEVICE

CROSS-REFERENCE TO RELATED APPLICATION

This application is a continuation of U.S. application Ser. No. 16/183,953, filed Nov. 8, 2018, which claims priority from Korean Patent Application No. 10-2017-0148717, filed on Nov. 9, 2017 in the Korean Intellectual Property Office, the disclosure of which is incorporated herein in its entirety by reference.

BACKGROUND

1. Field

Example embodiments of the present disclosure relate to a display device, and more particularly, to a high resolution display device having improved light efficiency and color quality.

2. Description of the Related Art

Liquid crystal displays (LCDs) and organic light-emitting diode (OLED) displays have been widely used as display devices. Recently, technologies for manufacturing high resolution display devices using micro-light emitting diodes (micro-LEDs) have been drawing attention. However, to manufacture a high resolution display device using a micro-LED, highly efficient small LED chips need to be manufactured, and a highly complex transfer technology is needed to arrange the small LED chips at appropriate positions.

SUMMARY

One or more example embodiments provide high resolution display devices having improved light efficiency and color quality.

According to an aspect of an example embodiment, there is provided a display device including a substrate, an emission layer configured to emit light, the emission layer comprising a first semiconductor layer provided on the substrate, an active layer provided on the first semiconductor layer, and a second semiconductor layer provided on the active layer, and configured to emit light, and a plurality of color converting layers provided on the emission layer and configured to emit light of predetermined colors from the light emitted from the emission layer, wherein the emission layer is provided to correspond to the plurality of color converting layers.

The display device may further include at least one first electrode electrically connected to the first semiconductor layer, and a plurality of second electrodes electrically connected to the second semiconductor layer.

The display device, wherein an area of the second semiconductor layer adjacent to a contact area between the second semiconductor layer and the second electrode may be etched to a predetermined depth or less.

The at least one first electrode may be provided to correspond to at least one of the plurality of color converting layers, to form a common electrode, and the plurality of second electrodes may be provided to have a one-to-one correspondence with the plurality of color converting layers.

The plurality of second electrodes may each be connected to a thin film transistor.

The display device may further include a current injection limitation layer provided on the second semiconductor layer and configured to limit current injected from the plurality of second electrodes into the second semiconductor layer.

The display device, wherein an area of the second semiconductor layer adjacent to a contact area between the second semiconductor layer and the second electrode via an open portion of the current injection limitation layer may be etched to a predetermined depth or less.

The current injection limitation layer may include an insulating film.

The current injection limitation layer may include a multilayer insulating film.

The multilayer insulating film may include plurality of layers having different refractive indexes, respectively.

The current injection limitation layer may include an insulating film and a metal reflection layer provided on the insulating film.

The metal reflection layer may include a first metal layer and a second metal layer provided on the first metal layer, the second metal layer having a reflectance that is higher than a reflectance of the first metal layer.

The current injection limitation layer may include a metal reflection layer provided on the second semiconductor layer, and an insulating film provided on the metal reflection layer.

The display device may further include a selective transparent insulating layer provided between the plurality of second electrodes and the plurality of color converting layers, and configured to transmit light emitted from the emission layer and to reflect light emitted from the plurality of color converting layers.

The display device may further include a selective shield layer provided on the plurality of color converting layers and configured to shield light of a predetermined color.

The display device may further include a light absorbing layer provided between the substrate and the first semiconductor layer or provided on the first semiconductor layer.

The display device may further include an index matching layer provided between the substrate and the first semiconductor layer and configured to reduce reflection of light.

The index matching layer may include aluminum nitride (AlN).

The display device may further include a light absorbing member provided on a surface of the substrate opposite to the emission layer.

The first semiconductor layer may include n-GaN, the second semiconductor layer may include p-GaN, and the active layer may include multi-quantum well (MQW) structure.

The emission layer may be configured to generate blue light.

The plurality of color converting layers may include a red converting layer configured to emit red light by being excited by the blue light, a green converting layer configured to emit green light by being excited by the blue light, and a blue transmitting layer configured to transmit blue light.

The emission layer may be configured to generate ultraviolet light.

The plurality of color converting layers may include a red converting layer configured to emit red light by being excited by the ultraviolet light, a green converting layer configured to emit green light by being excited by the ultraviolet light, and a blue converting layer configured to emit blue light by being excited by the ultraviolet light.

The emission layer may be formed by sequentially growing the first semiconductor layer, the active layer, and the second semiconductor layer on the substrate.

BRIEF DESCRIPTION OF THE DRAWINGS

The above and/or other aspects will become apparent and more readily appreciated from the following description of example embodiments, taken in conjunction with the accompanying drawings in which:

FIG. 19 is a plan view of an example circuit configuration of the display device of FIG. 17.

DETAILED DESCRIPTION

Figure 1:
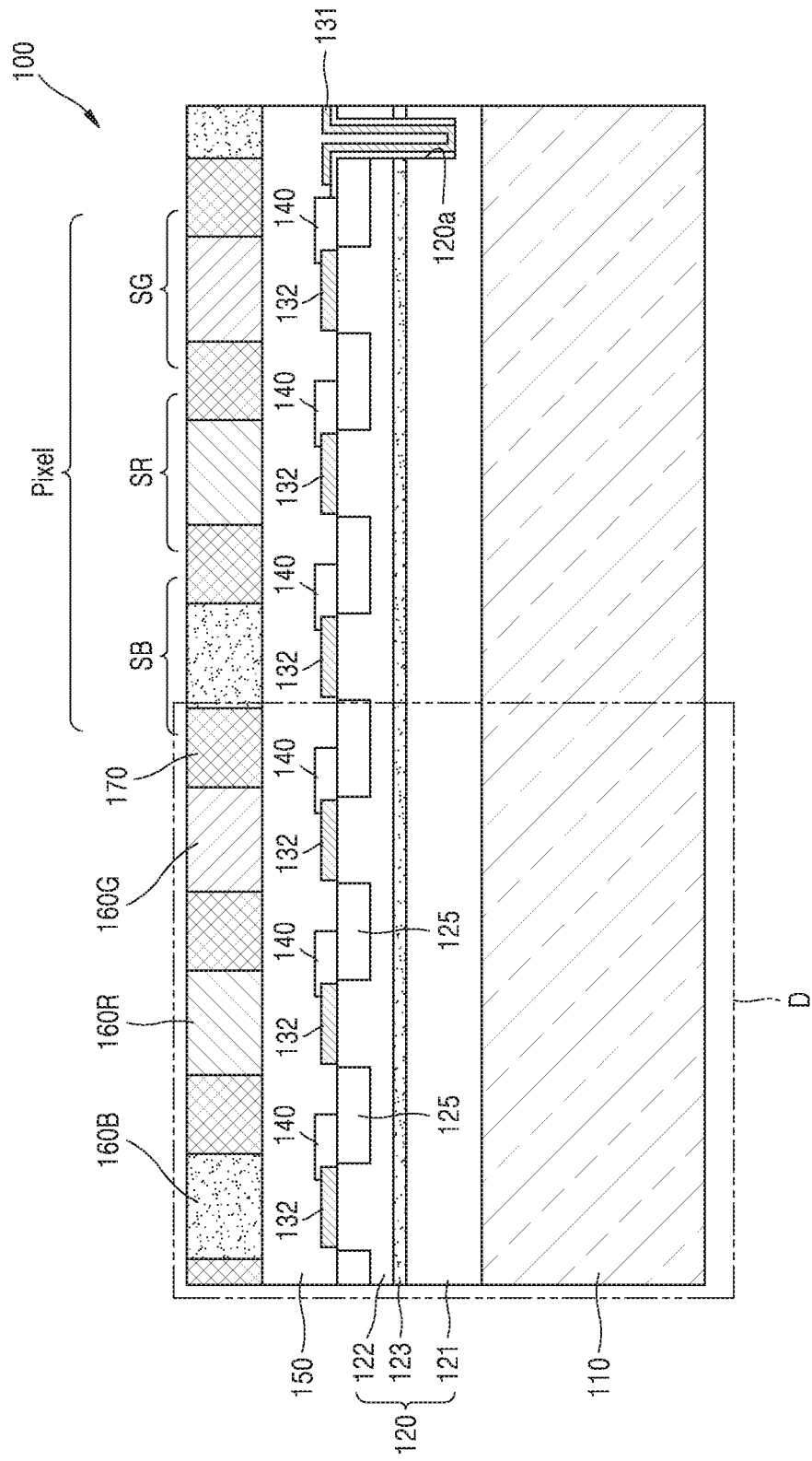
FIG. 1 is a cross-sectional view of a display device according to an example embodiment.

Reference will now be made in detail to embodiments, examples of which are illustrated in the accompanying drawings, wherein like reference numerals refer to like elements throughout. Also, the size of each layer illustrated in the drawings may be exaggerated for convenience of explanation and clarity. Example embodiments may have different forms and should not be construed as being limited to the descriptions set forth herein.

In the following description, when a constituent element is disposed "above" or "on" another constituent element, the constituent element may be directly located on the other constituent element and in contact or located on the other constituent element in a non-contact manner where one or more element may be located therebetween.

The expression of singularity in the present specification includes the expression of plurality unless clearly specified otherwise in context. Also, terms such as "comprise" and/or "comprising" may be construed to denote a constituent element, but may not be construed to exclude the existence of or a possibility of addition of one or more other constituent elements.

The use of the terms "a" and "an" and "the" and similar referents are to be construed to cover both the singular and the plural. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Also, the steps of all methods described herein can be performed in any suitable order unless otherwise indicated herein or otherwise clearly contradicted by context. The present disclosure is not limited to the described order of the steps. The use of any and all examples, or language (e.g., "such as") provided herein, is intended merely to better illuminate the inventive concept and does not pose a limitation on the scope of the present disclosure unless otherwise claimed.

Figure 2:
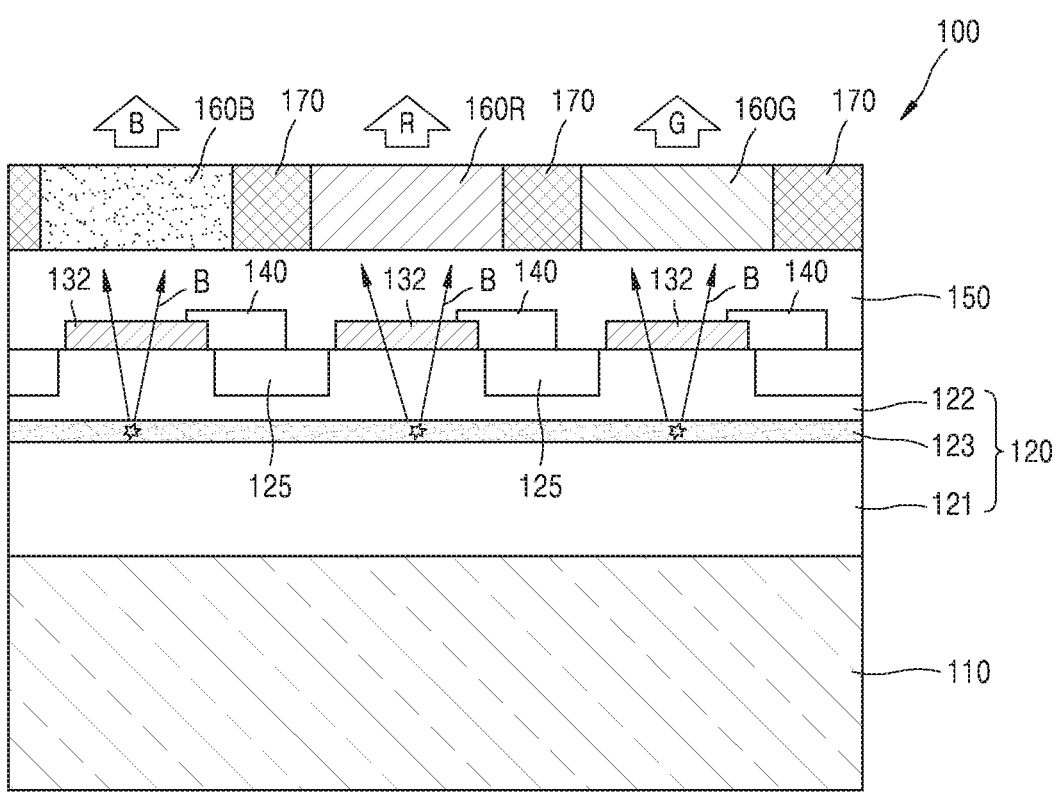
FIG. 2 is an enlarged cross-sectional view of a portion D of FIG. 1.

FIG. 1 is a cross-sectional view of a display device 100 according to an example embodiment. FIG. 2 is an enlarged cross-sectional view of a portion D of FIG. 1.

Referring to FIGS. 1 and 2, the display device 100 includes a plurality of pixels. In FIG. 1, only two pixels are illustrated for convenience of explanation and it will be understood that a display device can include more than two pixels. Each of the pixels may include a plurality of sub-pixels of different colors. In detail, each of the pixels may include a red subpixel SR, a green subpixel SG, and a blue subpixel SB.

The display device 100 may include a substrate 110, an emission layer 120 provided on the substrate 110, and a plurality of color converting layers 160R, 160G, and 160B provided on the emission layer 120.

The substrate 110 may be a growth substrate to grow the emission layer 120 thereon. The substrate 110 may include substrates formed of various materials used in a general semiconductor process. For example, a silicon substrate or a sapphire substrate may be used as the substrate 110. However, example embodiments are not limited thereto, and various other materials may be used for the substrate 110.

The emission layer 120 emitting blue light B is provided on an upper surface of the substrate 110. The emission layer 120 may be an inorganic based light-emitting diode (LED) layer. The emission layer 120 may be formed by sequentially growing a first semiconductor layer 121, an active layer 123, and a second semiconductor layer 122 on the upper surface of the substrate 110.

The first semiconductor layer 121 may be provided on the upper surface of the substrate 110. The first semiconductor layer 121 may include, for example, n-type semiconductor. However, example embodiments are not limited thereto, in some cases, the first semiconductor layer 121 may include p-type semiconductor. The first semiconductor layer 121 may include III-V group based n-type semiconductor, for example, n-gallium nitride (n-GaN). The first semiconductor layer 121 may have a monolayer or multilayer structure.

The active layer 123 may be provided on an upper surface of the first semiconductor layer 121. The active layer 123 may emit blue light B as electrons and holes being combined with each other. The active layer 123 may have a multi-quantum well (MQW) structure. However, example embodiments are not limited thereto, in some cases, the active layer 123 may have a single-quantum well (SQW) structure. The active layer 123 may include III-V group based semiconductor, for example, gallium nitride (GaN). According to an example embodiment as illustrated in FIG. 2, the active layer 123 may be formed in a two dimensional (2D) thin film shape. However, example embodiments are not limited thereto, and the active layer 123 may be formed in a three-dimensional (3D) shape of a rod or pyramid structure through growth using a mask.

The second semiconductor layer 122 may be provided on an upper surface of the active layer 123. The second semiconductor layer 122 may include, for example, p-type semiconductor. However, example embodiments are not limited thereto, in some cases, the second semiconductor layer 122 may include n-type semiconductor. The second semiconductor layer 122 may include III-V group based p-type semiconductor, for example, p-GaN. The second semiconductor layer 122 may have a monolayer or multilayer structure.

The color converting layers 160R, 160G, and 160B that may emit light of certain colors by converting or transmitting the blue light B emitted from the active layer 123 of the emission layer 120 are provided above the emission layer 120. The color converting layers 160R, 160G, and 160B may be provided corresponding to the emission layer 120 grown on the substrate 110. In detail, the color converting layers 160R, 160G, and 160B may include the red converting layer 160R, the green converting layer 160G, and the blue transmitting layer 160B. The red converting layer 160R, the green converting layer 160G, and the blue transmitting layer 160B may correspond to the red subpixel SR, the green subpixel SG, and the blue subpixel SB, respectively.

The red converting layer 160R may convert the blue light B emitted from the active layer 123 to red light R and emit the red light R. The red converting layer 160R may include quantum dots (QDs) having a certain size, which are excited by the blue light B to emit the red light R. A QD may have a core-shell structure having a core part and a shell part, and may have a particle structure having no shell. The core-shell structure may have a single-shell or a multi-shell. The multi-shell may be, for example, a double-shell.

The QD may include at least one of, for example, II-VI group based semiconductor, III-V group based semiconductor, IV-VI group based semiconductor, IV group based semiconductor, and a graphene QD. For example, the QD may include at least one of cadmium (Cd), selenium (Se), zinc (Zn), sulfur (S), and indium phosphide (InP), but example embodiments are not limited thereto. Each QD may have a diameter of several tens of nanometers or less, for example, about 10 nm or less. Furthermore, the red converting layer 160R may include phosphor that is excited by the blue light B emitted from the active layer 123 and emits the red light R. The red converting layer 160R may further include photoresist having higher transmission characteristics or a light scattering agent to more uniformly emit the red light R.

The green converting layer 160G may convert the blue light B emitted from the active layer 123 to green light G and emit the green light G. The green converting layer 160G may include QDs having a certain size, which are excited by the blue light B and emit the green light G. Furthermore, the green converting layer 160G may include phosphor that is excited by the blue light B emitted from the active layer 123 and emits the green light G. The green converting layer 160G may further include photoresist or a light scattering agent.

The blue transmitting layer 160B may transmit the blue light B emitted from the active layer 123 to be emitted to the outside. The blue transmitting layer 160B may further include photoresist or a light scattering agent. A black matrix 170 for light absorption may be provided between the red converting layer 160R, the green converting layer 160G, and the blue transmitting layer 160B. The black matrix 170 may prevent crosstalk between each of the red converting layer 160R, the green converting layer 160G, and the blue transmitting layer 160B to improve contrast.

The emission layer 120 may include a first electrode 131 electrically connected to the first semiconductor layer 121 and a plurality of second electrodes 132 electrically connected to the second semiconductor layer 122. When the first and second semiconductor layers 121 and 122 include n-type semiconductor and p-type semiconductor, respectively, the first and second electrodes 131 and 132 may be n-type electrode and p-type electrode, respectively.

The first electrode 131 may serve as a common electrode to the subpixels SR, SG, and SB. For example, a groove 120a for exposing the first semiconductor layer 121 may be formed in the emission layer 120 to a certain depth by sequentially etching the second semiconductor layer 122, the active layer 123, and the first semiconductor layer 121. The first electrode 131 may be provided to contact the first semiconductor layer 121 exposed via the groove 120a. An insulating material for insulating the first electrode 131 from the first semiconductor layer 121 and the active layer 123 may be provided in an inner wall of the groove 120a.

FIG. 1 illustrates an example embodiment in which the first electrode 131 is provided to commonly correspond to the six subpixels SR, SG, and SB. However, example embodiments are not limited thereto, and the number of the subpixels SR, SG, and SB corresponding to the single first electrode 131, may vary. The first electrode 131 may include a material having higher conductivity.

The second electrodes 132 may be provided on the second semiconductor layer 122. The second electrodes 132 may be provided to have a one-to-one correspondence with the subpixels SR, SG, and SB, that is, the color converting layers 160R, 160G, and 160B. The second electrodes 132 may be provided under each of the red converting layer 160R, the green converting layer 160G, and the blue transmitting layer 160B. The second electrodes 132 may include a transparent conductive material. For example, the second electrodes 132 may include indium tin oxide (ITO), zinc oxide (ZnO), indium zinc oxide (IZO), silver (Ag), gold (Au), graphene, or nanowire. However, example embodiments are not limited thereto.

A plurality of thin film transistors (TFTs) 140 electrically connected to the second electrodes 132 may be provided on the second semiconductor layer 122. The TFTs 140 selectively drives at least one of the subpixels SR, SG, and SB. The TFTs 140 may be provided under the black matrix 170.

An etching region 125 for preventing current injected from the second electrodes 132 into the second semiconductor layer 122 from flowing sideways may be formed in the second semiconductor layer 122 to a certain depth. The etching region 125 may be formed by etching an area around a contact area between the second semiconductor layer 122 and the second electrodes 132 to a certain depth or less. An insulating material may be provided in the etching region 125. The etching region 125 may be formed to a depth of, for example, ½ or ⅔ of the thickness of the second semiconductor layer 122, but example embodiments are not limited thereto. An insulating layer 150 may be provided to cover the second electrodes 132 and the TFTs 140.

According to the example embodiment as illustrated in FIG. 1, for example, when one of the TFTs 140 corresponding to the red subpixel SR is driven and a certain voltage is applied between the first electrode 131 that is a common electrode and one of the second electrodes 132 corresponding to the red subpixel SR, the blue light B is emitted from the active layer 123 located under the red converting layer 160R. When the blue light B emitted as above is incident on the red converting layer 160R, the red converting layer 160R emits the red light R to the outside. Furthermore, for example, when one of the TFTs 140 corresponding to the green subpixel SG is driven and a certain voltage is applied between the first electrode 131 that is a common electrode and one of the second electrodes 132 corresponding to the green subpixel SG, the blue light B is emitted from the active layer 123 located under the green converting layer 160G. When the blue light B emitted as above is incident on the green converting layer 160G, the green converting layer 160G emits the green light G to the outside.

For example, when one of the TFTs 140 corresponding to the blue subpixel SB is driven and a certain voltage is applied between the first electrode 131 that is a common electrode and one of the second electrodes 132 corresponding to the blue subpixel SB, the blue light B is emitted from the active layer 123 located under the blue transmitting layer 160B. The blue light B emitted from the active layer 123 is transmitted through the blue transmitting layer 160B to be emitted to the outside. FIG. 2 illustrates an example embodiment in which the red light R, the green light G, and the blue light B are emitted to the outside from the red converting layer 160R, the green converting layer 160G, and the blue transmitting layer 160B, respectively.

To implement a high resolution display device, smaller LED chips corresponding to the subpixels may need to be separately manufactured and the smaller LED chips need to be transferred to appropriate positions. In this case, as the active layers that are emission areas are separated from each other for each subpixel, exposure areas of the active layers increase, and thus, light efficiency may be deteriorated. Also, a process of transferring the small LED chips to accurate positions may require a more complex transfer technology. In the display device according to an example embodiment, since a plurality of subpixels are provided corresponding to one emission layer, in detail, the active layer, the active layers that are emission areas may not be separated from each other for each subpixel, which may improve light efficiency. Furthermore, since a portion around the contact area between the second semiconductor layer and the second electrode may be etched to a certain depth or less, the current injected from the second electrode may be prevented or reduced from flowing sideways. Furthermore, since the emission layer is directly formed on the substrate through growth, the transfer process may be less difficult.

Figure 3:
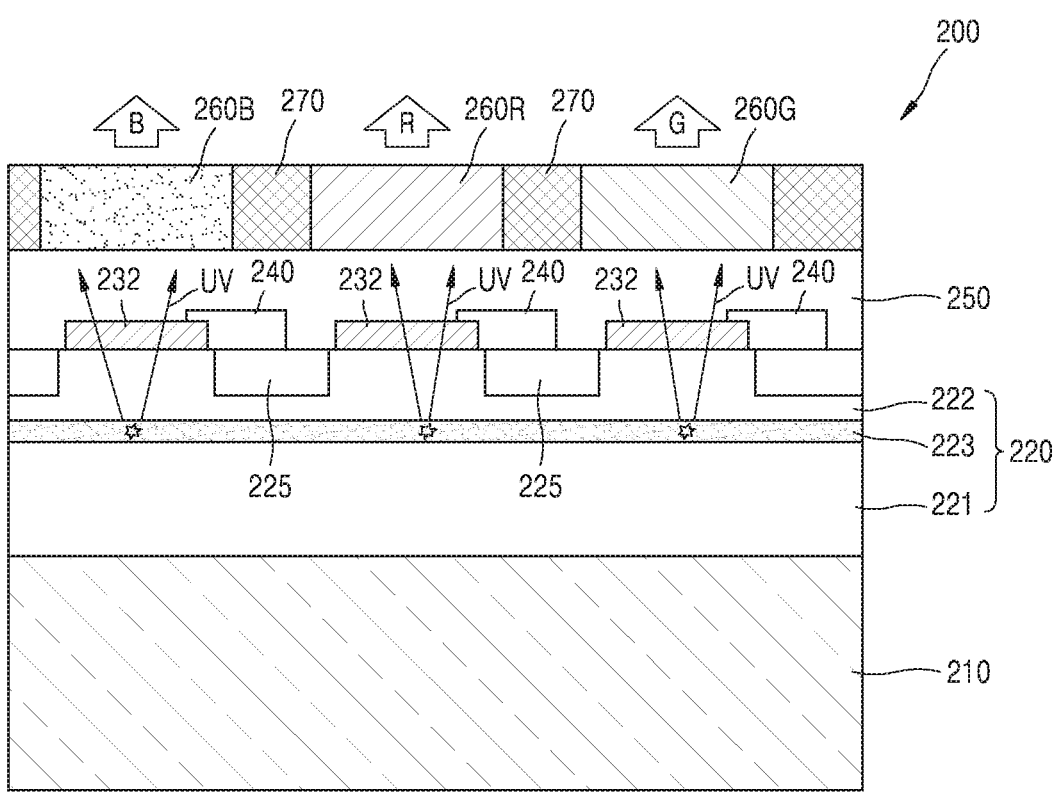
FIG. 3 is a cross-sectional view of a display device according to an example embodiment.

FIG. 3 is a cross-sectional view of a display device 200 according to an example embodiment.

Referring to FIG. 3, the display device 200 may include a substrate 210, an emission layer 220 provided on the substrate 210, and the color converting layers 260R, 260G, and 260B provided on the emission layer 220. For example, a silicon substrate or a sapphire substrate may be used as the substrate 210, but example embodiments are not limited thereto.

The emission layer 220 that emits an ultraviolet (UV) ray may be provided on the substrate 210. The emission layer 220 may be an inorganic material based LED layer. The emission layer 220 may be formed on an upper surface of the substrate 210 by sequentially growing a first semiconductor layer 221, an active layer 223, and a second semiconductor layer 222.

The first semiconductor layer 221 provided on the upper surface of the substrate 210 may include, for example, n-type semiconductor. For example, the first semiconductor layer 221 may include III-V group based n-type semiconductor, for example, n-GaN. The active layer 223 provided on an upper surface of the first semiconductor layer 221 may generate the UV ray as electrons and holes being combined with each other. The active layer 223 may have, for example, a MQW structure. The active layer 223 may include III-V group based semiconductor, for example, GaN. The second semiconductor layer 222 provided on an upper surface of the active layer 223 may include, for example, p-type semiconductor. The second semiconductor layer 222 may include III-V group based p-type semiconductor, for example, p-GaN.

The color converting layers 260R, 260G, and 260B that emit light of certain colors by converting the UV ray emitted from the active layer 223 are provided above the emission layer 220. The color converting layers 260R, 260G, and 260B may be provided corresponding to the single emission layer 220. The color converting layers 260R, 260G, and 260B may include a red converting layer 260R, a green converting layer 260G, and a blue converting layer 260B. The red converting layer 260R, the green converting layer 260G, and the blue converting layer 260B may correspond to the red subpixel SR, the green subpixel SG, and the blue subpixel SB, respectively.

The red converting layer 260R may convert the UV ray emitted from the active layer 223 to the red light R and emit the red light R. The red converting layer 260R may include QDs having a certain size and emitting the red light R by being excited by the UV ray. The QD may have, for example, core-shell structure. The QD may include, for example, at least one of II-VI group based semiconductor, III-V group based semiconductor, IV-VI group based semiconductor, IV group based semiconductor, and a graphene QD. For example, the QD may include at least one of Cd, Se, Zn, S, and InP, but example embodiments are not limited thereto. The green converting layer 260G may convert the UV ray emitted from the active layer 223 to the green light G and emit the green light G. The green converting layer 260G may include QDs having a certain size and emitting the green light G by being excited by the UV ray. The blue converting layer 260B may convert the UV ray emitted from the active layer 223 to the blue light B and emit the blue light B. The blue converting layer 260B may include QDs having a certain size and emitting the blue light B by being excited by the UV ray. A black matrix 270 for light absorption may be provided between each of the red converting layer 260R, the green converting layer 260G, and the blue converting layer 260B.

The emission layer 220 may include a first electrode electrically connected to the first semiconductor layer 221 and a plurality of second electrodes 232 electrically connected to the second semiconductor layer 222. When the first and second semiconductor layers 221 and 222 include n-type semiconductor and p-type semiconductor, respectively, the first electrode and the second electrodes 232 may be an n-type electrode and a p-type electrode, respectively.

As described above, the first electrode may serve as a common electrode with respect to the subpixels SR, SG, and SB. For example, a groove for exposing the first semiconductor layer 221 may be formed in the emission layer 220 to a certain depth. The first electrode may be provided to contact the first semiconductor layer 221 that is exposed by the groove. The number of the subpixels SR, SG, and SB that commonly correspond to the first electrode may vary.

The second electrodes 232 may be provided in the second semiconductor layer 222 to have a one-to-one correspondence with the subpixels SR, SG, and SB, that is, the color converting layers 260R, 260G, and 260B. The second electrodes 232 may include a transparent conductive material.

Furthermore, a plurality of TFTs 240 electrically connected to the second electrodes 232 may be provided on the second semiconductor layer 222.

An etching region 225 for preventing a flow of current injected from the second electrodes 232 into the second semiconductor layer 222 from flowing sideways may be formed in the second semiconductor layer 222 to a certain depth. The etching region 225 may be formed by etching an area around a contact area between the second semiconductor layer 222 and the second electrodes 232 to a certain depth or less. An insulating layer may be provided to cover the second electrodes 232 and the TFTs 240.

According to the example embodiment as illustrated in FIG. 3, for example, when one of the TFTs 240 corresponding to the red subpixel SR is driven and a certain voltage is applied between the first electrode that is a common electrode and one of the second electrodes 232 corresponding to the red subpixel SR, the UV ray is emitted from the active layer 223 located under the red converting layer 260R. When the UV ray emitted from the active layer 223 as above is incident on the red converting layer 260R, the red converting layer 260R emits the red light R to the outside. Furthermore, for example, when the TFT 240 corresponding to the green subpixel SG is driven and a certain voltage is applied between the first electrode that is a common electrode and the second electrode 232 corresponding to the green subpixel SG, the UV ray is emitted from the active layer 223 located under the green converting layer 260G. When the UV ray emitted from the active layer 223 as above is incident on the green converting layer 260G, the green converting layer 260G emits the green light G to the outside.

For example, when the TFT 240 corresponding to the blue subpixel SB is driven and a certain voltage is applied between the first electrode that is a common electrode and the second electrode 232 corresponding to the blue subpixel SB, the UV ray is emitted from the active layer 223 located under the blue converting layer 260B. When the UV ray emitted as above is incident on the blue converting layer 260B, the blue converting layer 260B emits the blue light B to the outside. FIG. 3 illustrates an example embodiment in which the red light R, the green light G, and the blue light B are respectively emitted from the red converting layer 260R, the green converting layer 260G, and the blue converting layer 260B, to the outside.

In the display device 200 according to an example embodiment, as illustrated in FIG. 3, since the subpixels SR, SG, and SB are provided corresponding to a single emission layer 220, the active layer 223 that is an emitting area is not separated into the subpixels SR, SG, and SB, and thus light efficiency may be improved.

Figure 4:
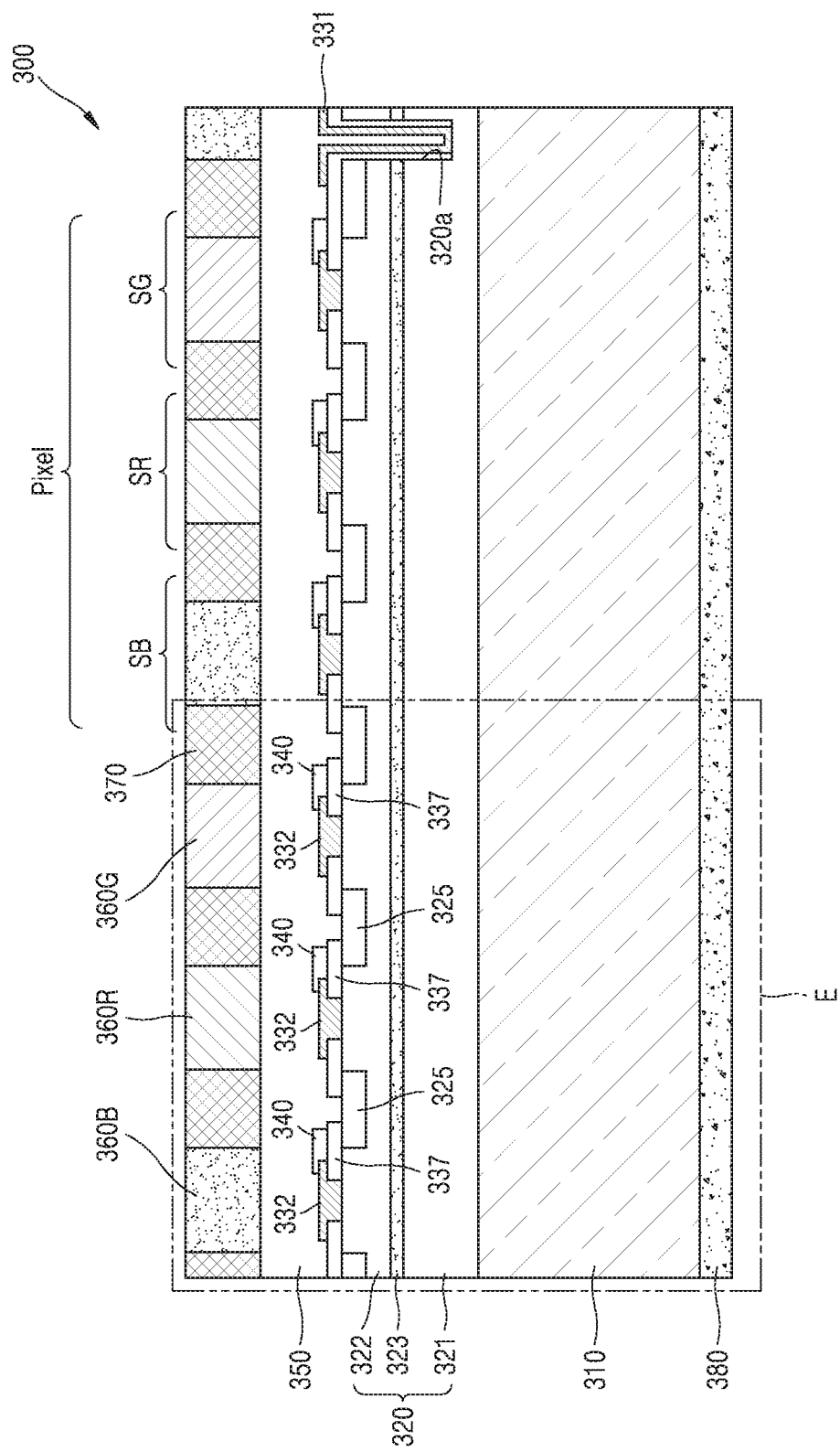
FIG. 4 is a cross-sectional view of a display device according to an example embodiment.
Figure 5:
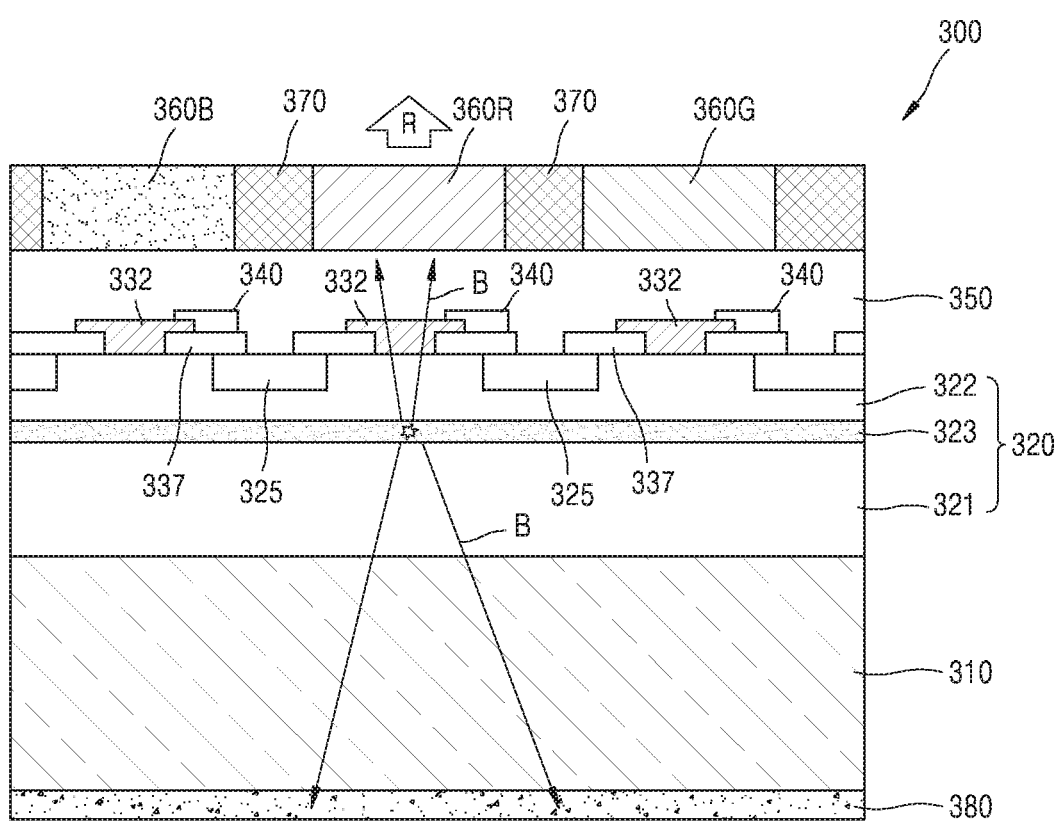
FIG. 5 is an enlarged cross-sectional view of a portion E of FIG. 4.

FIG. 4 is a cross-sectional view of a display device 300 according to an example embodiment. FIG. 5 is an enlarged cross-sectional view of a portion E of FIG. 4.

Referring to FIGS. 4 and 5, the display device 300 may include a plurality of pixels, and each of the plurality of pixels may include the red subpixel SR, the green subpixel SG, and the blue subpixel SB. An emission layer 320 is provided on a substrate 310, and a plurality of color converting layers 360R, 360G, and 360B are provided on the emission layer 320.

A substrate for growth, for example, a silicon substrate or a sapphire substrate, may be used as the substrate 310. The emission layer 320 for emitting the blue light B is provided on an upper surface of the substrate 310. The emission layer 320 may be formed by sequentially growing a first semiconductor layer 321, an active layer 323, and a second semiconductor layer 322 on the upper surface of the substrate 310.

The first semiconductor layer 321 provided on the upper surface of the substrate 310 may include, for example, n-type semiconductor. The first semiconductor layer 321 may include III-V group based n-type semiconductor, for example, n-GaN. The active layer 323 provided on an upper surface of the first semiconductor layer 321 may generate the blue light B as electrons and holes being combined with each other. The active layer 323 may have, for example, a MQW structure. The active layer 323 may be formed in a 2D thin film shape or in a 3D shape. The second semiconductor layer 322 may be provided on an upper surface of the active layer 323. The second semiconductor layer 322 may include, for example, p-type semiconductor. The second semiconductor layer 322 may include III-V group based p-type semiconductor, for example, p-GaN.

The color converting layers 360R, 360G, and 360B that emit light of certain colors by the blue light B emitted from the active layer 323 of the emission layer 320 are provided above the emission layer 320. The color converting layers 360R, 360G, and 360B may be provided corresponding to the single emission layer 320 and grown from the substrate 310. For example, the color converting layers 360R, 360G, and 360B may include a red converting layer 360R, a green converting layer 360G, and a blue transmitting layer 360B. The red converting layer 360R, the green converting layer 360G, and the blue transmitting layer 360B may correspond to the red subpixel SR, the green subpixel SG, and the blue subpixel SB, respectively.

The red converting layer 360R may convert the blue light B emitted from the active layer 323 to the red light R and emit the red light R. The red converting layer 360R may include QDs having a certain size or phosphor. The green converting layer 360G may convert the blue light B emitted from the active layer 323 to the green light G and emit the green light G. The green converting layer 360G may include QDs having a certain size or phosphor. The blue transmitting layer 360B may transmit the blue light B emitted from the active layer 323 to be emitted to the outside. A black matrix 370 for light absorption may be provided between each of the red converting layer 360R, the green converting layer 360G, and the blue transmitting layer 360B.

The emission layer 320 may include a first electrode 331 electrically connected to the first semiconductor layer 321 and a plurality of second electrodes 332 electrically connected to the second semiconductor layer 322. When the first and second semiconductor layers 321 and 322 include n-type semiconductor and p-type semiconductor, respectively, the first and second electrodes 331 and 332 may be an n-type electrode and a p-type electrode, respectively.

The first electrode 331 may serve as a common electrode with respect to the subpixels SR, SG, and SB. For example, a groove 320a for exposing the first semiconductor layer 321 may be formed in the emission layer 320 to a certain depth by sequentially etching the second semiconductor layer 322, the active layer 323, and the first semiconductor layer 321. The first electrode 331 may be provided to contact the first semiconductor layer 321 exposed via the groove 320a. An insulating material for insulating the first electrode 331 from the first semiconductor layer 321 and the active layer 323 may be provided in an inner wall of the groove 320a.

FIG. 4 illustrates an example embodiment in which the first electrode 331 is provided to commonly correspond to all six of the subpixels SR, SG, and SB. However, example embodiments are not limited thereto, and the number of the subpixels SR, SG, and SB commonly corresponding to the single first electrode 331 may vary.

The second electrodes 332 may be provided on the second semiconductor layer 322. The second electrodes 332 may be provided to have a one-to-one correspondence with the subpixels SR, SG, and SB, that is, the color converting layers 360R, 360G, and 360B. The second electrodes 332 each may be respectively provided under the red converting layer 360R, the green converting layer 360G, and the blue transmitting layer 360B. The second electrodes 332 may include a transparent conductive material. For example, the second electrodes 332 may include ITO, ZnO, IZO, Ag, Au, graphene, or nanowire. A plurality of TFTs 340 electrically connected to the second electrodes 332 are provided on the second semiconductor layer 322. The TFTs 340 may be provided under the black matrix 370.

A current injection limitation layer 337 for limiting current injected from the second electrodes 332 into the second semiconductor layer 322 may be provided on the second semiconductor layer 322. The blue light B emitted from the active layer 323 located under at least one of the color converting layers 360R, 360G, and 360B may proceed sideways. In this case, since light of an undesired color may be emitted to the outside from the neighboring color converting layers 360R, 360G, and 360B, color quality may deteriorate.

To prevent or reduce undesired color from being emitted, in an example embodiment, the current injection limitation layer 337 may be provided on the second semiconductor layer 322. The current injection limitation layer 337 may reduce a contact area between the second semiconductor layer 322 and the second electrodes 332. In this case, due to the current injection limitation layer 337, the contact area between the second semiconductor layer 322 and the second electrodes 332 may have a smaller area than each of the color converting layers 360R, 360G, and 360B, and correspond to a center portion of each of the color converting layers 360R, 360G, and 360B. Due to the current injection limitation layer 337, the current injected from the second electrodes 332 into the second semiconductor layer 322 may be limited. Accordingly, an emission area of the blue light B emitted from the active layer 323 located under at least one of the color converting layers 360R, 360G, and 360B may be reduced. Thus, the deterioration of color quality occurring when the blue light B emitted from the active layer 323 located under at least one of the color converting layers 360R, 360G, and 360B proceeds to adjacent one of the color converting layers 360R, 360G, and 360B, thereby emitting light of an undesired color, may be reduced or prevented.

The current injection limitation layer 337 may include an insulating film having a certain thickness. The insulating film may include, for example, silicon dioxide ($SiO_2$), silicon nitride (SiN), aluminium oxide ($Al_2O_3$), or titanium oxide ($TiO_2$), but example embodiments are not limited thereto.

An etching region 325 for preventing current injected from the second electrodes 332 into the second semiconductor layer 322 from flowing sideways may be formed in the second semiconductor layer 322 to a certain depth. The etching region 325 may be formed by etching an area around the contact area between the second semiconductor layer 322 and the second electrodes 332 through an open portion of the current injection limitation layer 337 to a certain depth or less. The etching region 325 may be provided with an insulating material. An insulating layer 350 may be provided to cover the second electrodes 332, the TFTs 340, and the current injection limitation layer 337.

A light absorbing member 380 may be further provided on a lower surface of the substrate 310. The light absorbing member 380 may absorb the blue light B emitted from the active layer 323 and transmitted through the substrate 310, thereby reducing or preventing the blue light B from being reflected from the lower surface of the substrate 310 and proceeding to an upper portion of the substrate 310. The light absorbing member 380 may include a material having a refractive index similar to the substrate 310. For example, the light absorbing member 380 may include a polymer based material.

FIG. 5 illustrates an example embodiment in which the red light R is emitted from the red converting layer 360R. Referring to FIG. 5, when one of the TFTs 340 corresponding to the red subpixel SR is driven and a certain voltage is applied between a first electrode 331 that is a common electrode and one of the second electrodes 332 corresponding to the red subpixel SR, the blue light B is emitted from the active layer 323 located under the red converting layer 360R. When the blue light B emitted from the active layer 323 as above is incident on the red converting layer 360R, the red converting layer 360R emits the red light R to the outside. In this case, since the contact area between the second semiconductor layer 322 and the second electrodes 332 is reduced by the current injection limitation layer 337, the emission area of the blue light B emitted from the active layer 323 located under the red converting layer 360R decreases. Accordingly, the emission of light of an undesired color occurring as the blue light B emitted from the active layer 323 located under the red converting layer 360R proceeds to the green converting layer 360G or the blue converting layer 360B may be reduced or prevented. Furthermore, since the blue light B emitted from the active layer 323 and transmitted through the substrate 310 may be absorbed by the light absorbing member 380 provided on a lower surface of the substrate 310, the blue light B may be reduced or prevented from being reflected from the lower surface of the substrate 310 and proceeding to an upper portion of the substrate 310. Since a portion around the contact area between the second semiconductor layer 322 and the second electrodes 332 is etched to a certain depth or less, the current injected from the second electrodes 332 into the second semiconductor layer 322 may be reduced or prevented from flowing sideways.

Figure 6:
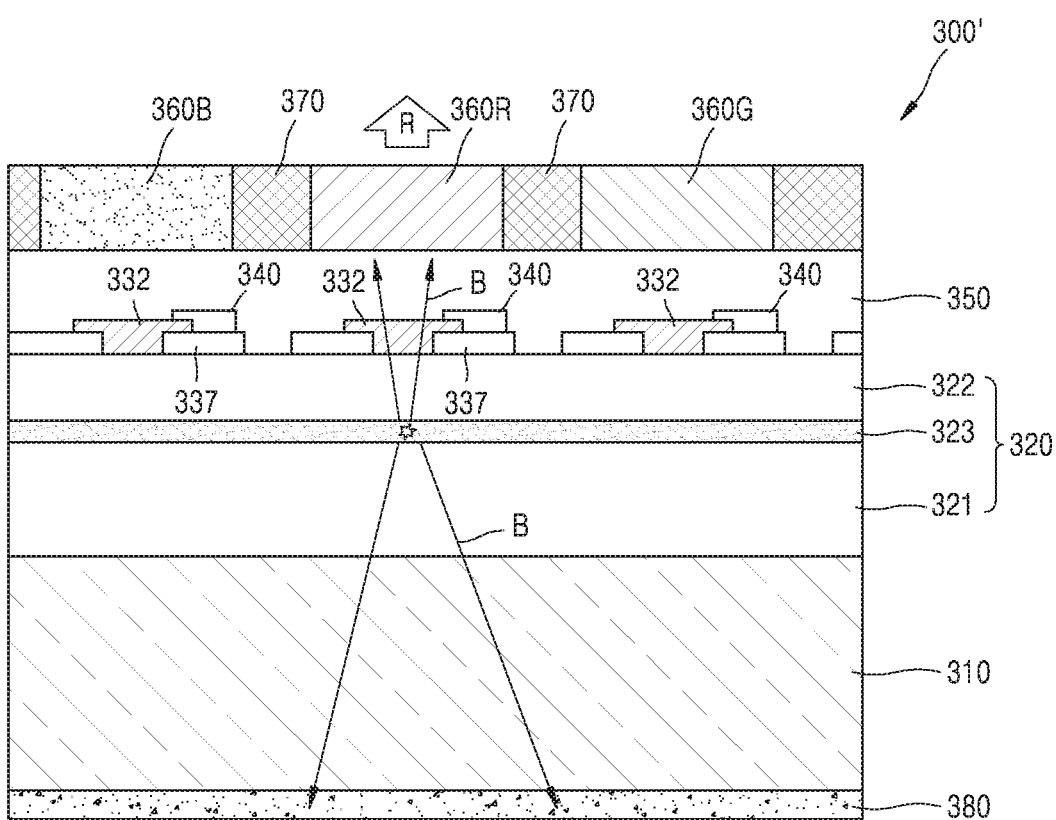
FIG. 6 is a cross-sectional view of a display device according to an example embodiment.

FIG. 6 is a cross-sectional view of a display device 300' according to an example embodiment. The display device 300' of FIG. 6 is substantially the same as the display device 300 of FIG. 5, except that the etching region 325 of FIG. 5 is not formed in the second semiconductor layer 322.

Figure 7:
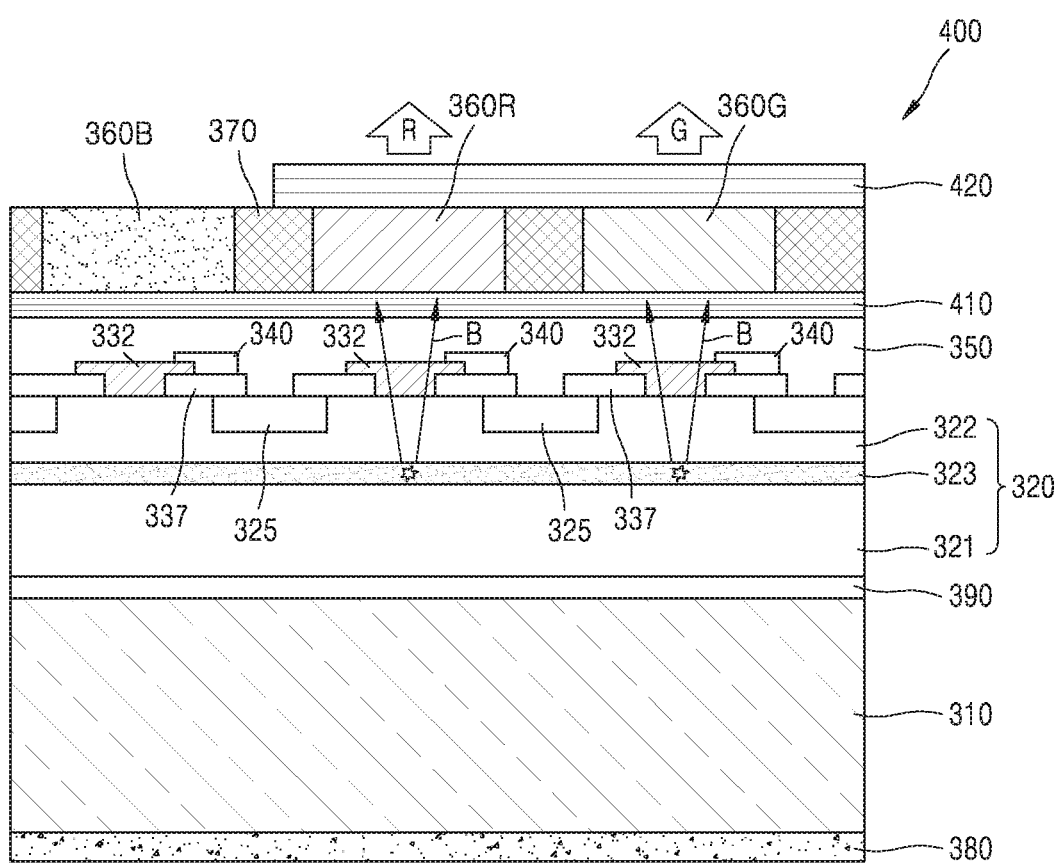
FIG. 7 is a cross-sectional view of a display device according to an example embodiment.

FIG. 7 is a cross-sectional view of a display device 400 according to an example embodiment. The display device 400 of FIG. 7 is substantially the same as the display device 300 of FIG. 5, except that the display device 400 of FIG. 7 includes a selective transparent insulating layer 410 and a selective shield layer 420.

Referring to FIG. 7, the selective transparent insulating layer 410 may be provided between the second electrodes 332 and the color converting layers 360R, 360G, and 360B. The selective transparent insulating layer 410 may transmit the blue light B emitted from the active layer 323 of the emission layer 320 and reflect light emitted from the color converting layers 360R, 360G, and 360B. The selective transparent insulating layer 410 may have a multilayer structure having different refractive indexes.

The selective shield layer 420 for shielding light of a specific color may be further provided on the color converting layers 360R and 360G. For example, the selective shield layer 420 may be provided on the red converting layer 360R and the green converting layer 360G, and may include a blue cutoff filter for preventing emission of the blue light B emitted from the active layer 323 to the outside. The selective shield layer 420 may include, for example, resin or a multilayer insulating film.

FIG. 7 illustrates an example embodiment in which the red light R and the green light G are emitted from the red converting layer 360R and the green converting layer 360G, respectively. Referring to FIG. 7, the blue light B may be emitted from the active layer 323 located under the red converting layer 360R and the green converting layer 360G, and then the blue light B emitted from the active layer 323 as above may be transmitted through the selective transparent insulating layer 410 and incident on the red converting layer 360R and the green converting layer 360G. Thus, the red light R and the green light G may be emitted from the red converting layer 360R and the green converting layer 360G, respectively. The red light R and the green light G may be emitted to the outside through the selective shield layer 420.

Figure 8:
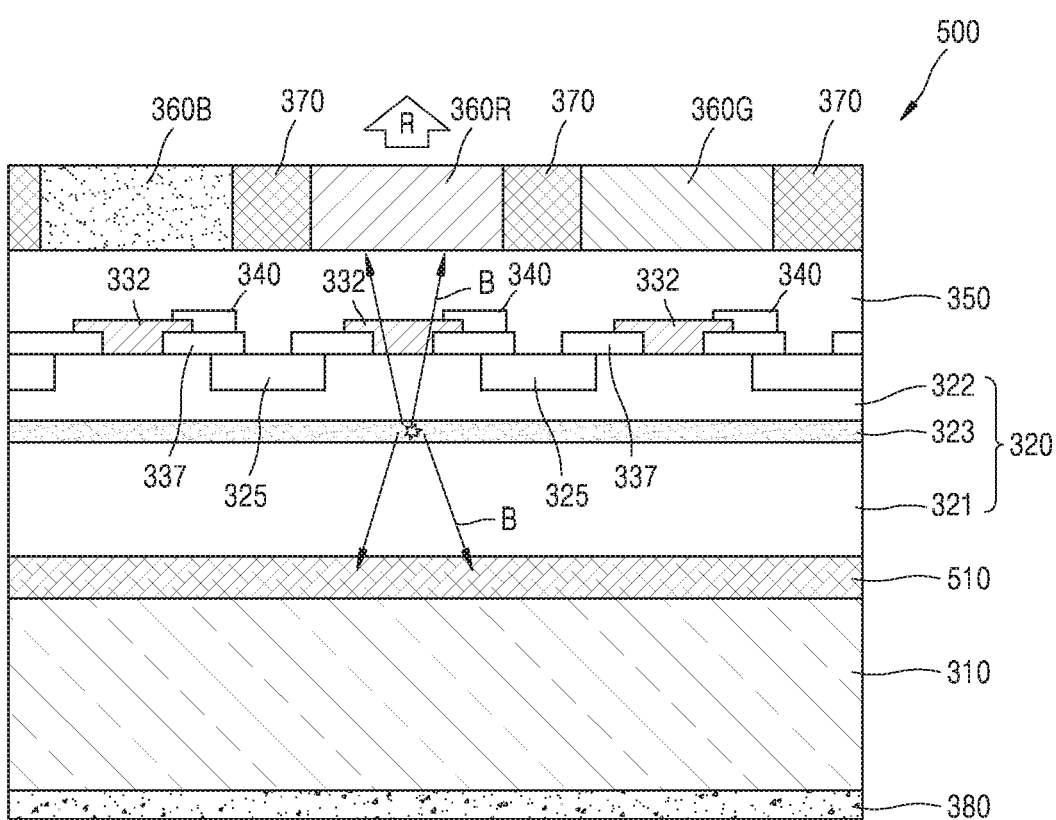
FIG. 8 is a cross-sectional view of a display device according to an example embodiment.

FIG. 8 is a cross-sectional view of a display device 500 according to an example embodiment. The display device 500 of FIG. 8 is substantially the same as the display device 300 of FIG. 5, except that the display device 500 of FIG. 8 further includes a light absorbing layer 510.

Referring to FIG. 8, the light absorbing layer 510 may be provided between the substrate 310 and the first semiconductor layer 321. The light absorbing layer 510 may absorb the blue light B emitted from the active layer 323. The light absorbing layer 510 may include, for example, carbon nanotubes (CNTs), graphene, aluminium gallium nitride (AlGaN), indium gallium nitride (InGaN), InGaN/GaN superlattice, AlGaN/GaN superlattice, titanium nitride (TiN), tungsten nitride (WN), or boron nitride (BN), but the present disclosure is not limited thereto.

FIG. 8 illustrates an example embodiment in which the red light R is emitted from the red converting layer 360R. Referring to FIG. 8, the blue light B is emitted from the active layer 323 located under the red converting layer 360R, and the blue light B emitted from the active layer 323 as above is incident on the red converting layer 360R to generate and emit the red light R. The blue light B emitted from the active layer 323 and proceeding to the substrate 310 may be absorbed by the light absorbing layer 510 provided between the substrate 310 and the first semiconductor layer 321. As illustrated in FIG. 7, a selective transparent insulating layer may be further provided between the second electrode 322 and the color converting layers 360R, 360G, and 360B, and a selective shield layer may be further be provided on the color converting layers 360R, 360G, and 360B. FIG. 8 illustrates an example embodiment in which the light absorbing layer 510 is provided between the substrate 310 and the first semiconductor layer 321, and the light absorbing layer 510 may be provided in the first semiconductor layer 321.

According to an example embodiment as illustrated in FIG. 7, an index matching layer 390 may be provided between the substrate 310 and the first semiconductor layer 321. The index matching layer may reduce an amount of the blue light B reflected between the substrate 310 and the first semiconductor layer 321 by using a difference in the refractive index between the substrate 310 and the first semiconductor layer 321. The index matching layer 390 may include, for example, AlN. In this case, the index matching layer 390 may be formed by depositing AlN on the substrate 310 to a certain thickness, for example, about 10 nm to about 150 nm. However, example embodiments are not limited thereto.

Figure 9:
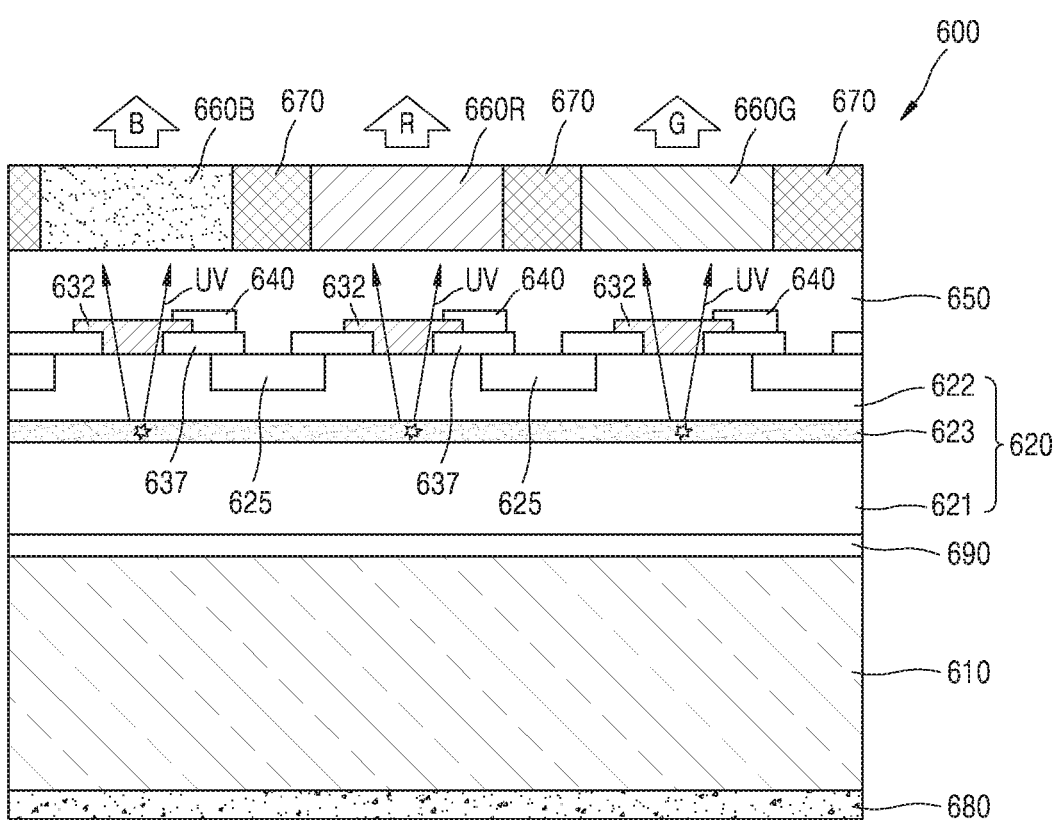
FIG. 9 is a cross-sectional view of a display device according to an example embodiment.

FIG. 9 is a cross-sectional view of a display device 600 according to an example embodiment. The display device 600 of FIG. 9 is substantially the same as the display device 300 of FIG. 5, except that a UV ray is emitted from an active layer 623.

Referring to FIG. 9, an emission layer 620 is provided on a substrate 610, and a plurality of color converting layers 660R, 660G, and 660B are provided above the emission layer 620. The emission layer 620 may be formed by sequentially growing a first semiconductor layer 621, the active layer 623, and a second semiconductor layer 622 on an upper surface of the substrate 610.

The first semiconductor layer 621 may include, for example, n-type semiconductor. For example, the first semiconductor layer 621 may include III-V group based n-type semiconductor, for example, n-GaN. The active layer 623 may generate the UV ray as electrons and holes are combined with each other. The active layer 623 may have, for example, a MQW structure. The second semiconductor layer 622 may include, for example, p-type semiconductor. In detail, the second semiconductor layer 622 may include III-V group based p-type semiconductor, for example, p-GaN.

The color converting layers 660R, 660G, and 660B, that is, a red converting layer 660R, a green converting layer 660G, and a blue converting layer 660B, for emitting light of certain colors by the UV ray emitted from the active layer 623 is provided above the emission layer 620. The red converting layer 660R may convert the UV ray emitted from the active layer 623 to the red light R and may emit the red light R. The green converting layer 660G may convert the UV ray emitted from the active layer 623 to the green light G and may emit the green light G. The blue converting layer 660B may convert the UV ray emitted from the active layer 623 to the blue light B and may emit the blue light B. A black matrix 670 for light absorption may be provided between each of the red converting layer 660R, the green converting layer 660G and the blue converting layer 660B.

The emission layer 620 may include a first electrode electrically connected to the first semiconductor layer 621 and a plurality of second electrodes 632 electrically connected to the second semiconductor layer 622. As described above, the first electrode may serve as a common electrode with respect to the subpixels SR, SG, and SB. The number of the subpixels SR, SG, and SB commonly corresponding to the first electrode may vary. The second electrodes 632 may be provided on the second semiconductor layer 622 to have a one-to-one correspondence with the subpixels SR, SG, and SB, that is, the color converting layers 660R, 660G, and 660B. A plurality of TFTs 640 electrically connected to the second electrodes 632 may be provided on the second semiconductor layer 622.

A current injection limitation layer 637 for limiting current injected from the second electrodes 632 into the second semiconductor layer 622 may be provided on the second semiconductor layer 622. The current injection limitation layer 637 may reduce or prevent emission of light of an undesired color by reducing a contact area between the second semiconductor layer 622 and the second electrodes 632. The current injection limitation layer 637 may include an insulating film having a certain thickness. The insulating film may include, for example, $SiO_2$, SiN, $Al_2O_3$, or $TiO_2$. An insulating layer 650 may be provided to cover the second electrodes 632, the TFTs 640, and the current injection limitation layer 637.

A light absorbing member 680 may be further provided on a lower surface of the substrate 610. As the light absorbing member 680 absorbs the UV ray emitted from the active layer 623 and transmitted through the substrate 610, the UV ray may be reduced or prevented from being reflected from the lower surface of the substrate 610 and proceeding to an upper portion of the substrate 610.

An etching region 625 for reducing or preventing the current injected from the second electrodes 632 into the second semiconductor layer 622 from flowing sideways may be formed in the second semiconductor layer 622 to a certain depth. The etching region 625 may be formed by etching an area around the contact area between the second semiconductor layer 622 and the second electrodes 632. FIG. 9 illustrates an example embodiment in which the UV ray is emitted from the active layer 623, and thus, the red light R, the green light G, and the blue light B are emitted from the red converting layer 660R, the green converting layer 660G, and the blue converting layer 660B, respectively, to the outside.

The display device 600 of FIG. 9 may further include a selective transparent insulating layer between the second electrodes 632 and the color converting layers 660R, 660G, and 660B, and a selective shield layer for shielding light of a specific color may be further provided on the color converting layers 660R, 660G, and 660B. The selective transparent insulating layer and the selective shield layer may be similar to those illustrated in FIG. 7. The selective shield layer may include, for example, red, green, and blue color filters. Furthermore, a light absorbing layer may be further provided between the substrate 610 and the first semiconductor layer 621, or in the first semiconductor layer 621, and an index matching layer 690 may be further provided between the substrate 610 and the first semiconductor layer 621.

Figure 10:
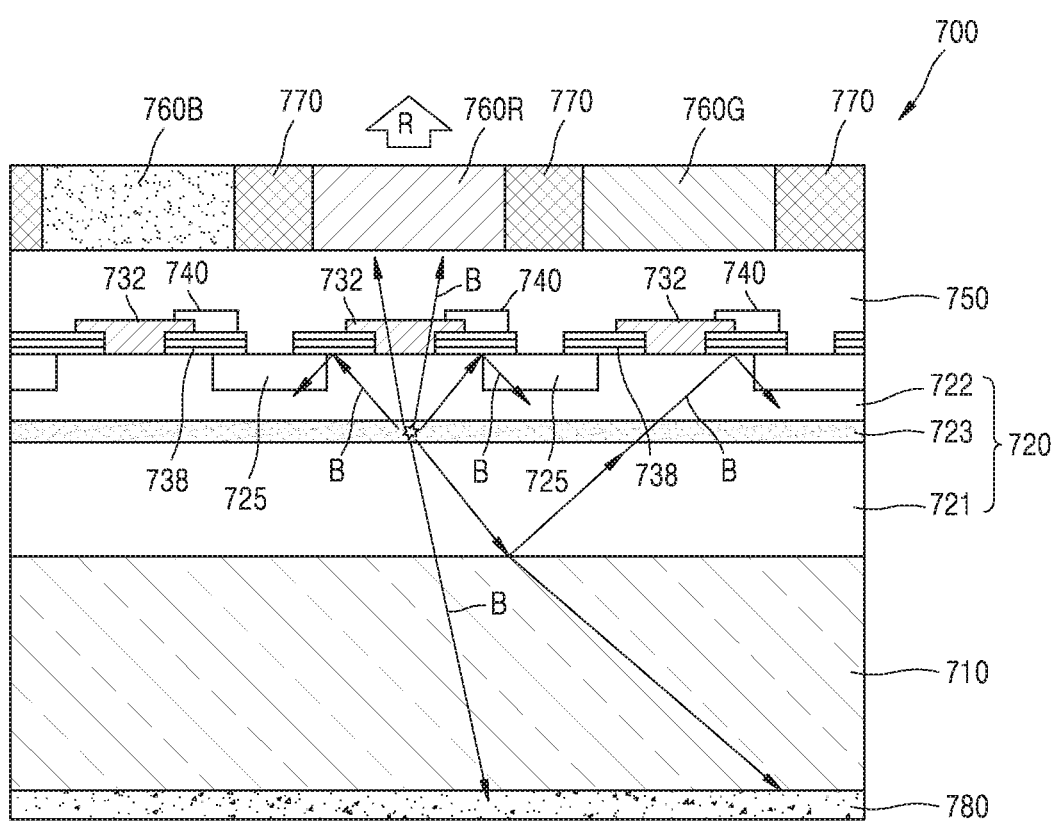
FIG. 10 is a cross-sectional view of a display device according to an example embodiment.

FIG. 10 is a cross-sectional view of a display device 700 according to an example embodiment. The display device 700 of FIG. 10 is substantially the same as the display device 300 of FIG. 5, except that a current injection limitation layer 738 is formed of a multilayer insulating film.

Referring to FIG. 10, an emission layer 720 is provided on a substrate 710, and a plurality of color converting layers 760R, 760G, and 760B are provided above the emission layer 720. The emission layer 720 may be formed by sequentially growing a first semiconductor layer 721, an active layer 723, and a second semiconductor layer 722 on an upper surface of the substrate 710.

The first semiconductor layer 721 may include, for example, n-type semiconductor. For example, the first semiconductor layer 721 may include III-V group based n-type semiconductor, for example, n-GaN. The active layer 723 may generate the blue light B as electrons and holes being combined with each other. The active layer 723 may have, for example, a MQW structure. The second semiconductor layer 722 may include, for example, p-type semiconductor. For example, the second semiconductor layer 722 may include III-V group based p-type semiconductor, for example, p-GaN.

The color converting layers 760R, 760G, and 760B, that is, a red converting layer 760R, a the green converting layer 760G, and a blue transmitting layer 760B, for emitting light of certain colors by converting or transmitting the blue light B emitted from the active layer 723 is provided above the emission layer 720. The red converting layer 760R may convert the blue light B emitted from the active layer 723 to the red light R and emit the red light B. The green converting layer 760G may convert the blue light B emitted from the active layer 723 to the green light G and emit the green light G. The blue transmitting layer 760B may transmit the blue light B emitted from the active layer 723 and emit the blue light B. A black matrix 770 for light absorption may be provided between the red converting layer 760R, the green converting layer 760G and the blue transmitting layer 760B.

The emission layer 720 may include a first electrode electrically connected to the first semiconductor layer 721 and a plurality of second electrodes 732 electrically connected to the second semiconductor layer 722. The first electrode may serve as a common electrode with respect to the subpixels SR, SG, and SB. The number of the subpixels SR, SG, and SB commonly corresponding to the first electrode may vary. The second electrodes 732 may be provided on the second semiconductor layer 722 to have a one-to-one correspondence with the subpixels SR, SG, and SB, that is, the color converting layers 760R, 760G, and 760B. A plurality of TFTs 740 electrically connected to the second electrodes 732 may be provided on the second semiconductor layer 722.

The current injection limitation layer 738 for limiting current injected from the second electrodes 732 into the second semiconductor layer 722 may be provided on the second semiconductor layer 722. The current injection limitation layer 738 may reduce or prevent emission of light of an undesired color by reducing a contact area between the second semiconductor layer 722 and the second electrodes 732.

The current injection limitation layer 738 may include a multilayer insulating film having a multilayer structure having different refractive indexes. The insulating film may include, for example, $SiO_2$, SiN, $Al_2O_3$, or $TiO_2$. As illustrated in FIG. 10, the current injection limitation layer 738 formed of a multilayer insulating film may reflect the blue light B that is emitted from the active layer 723 and proceeding sideways.

Figure 11:
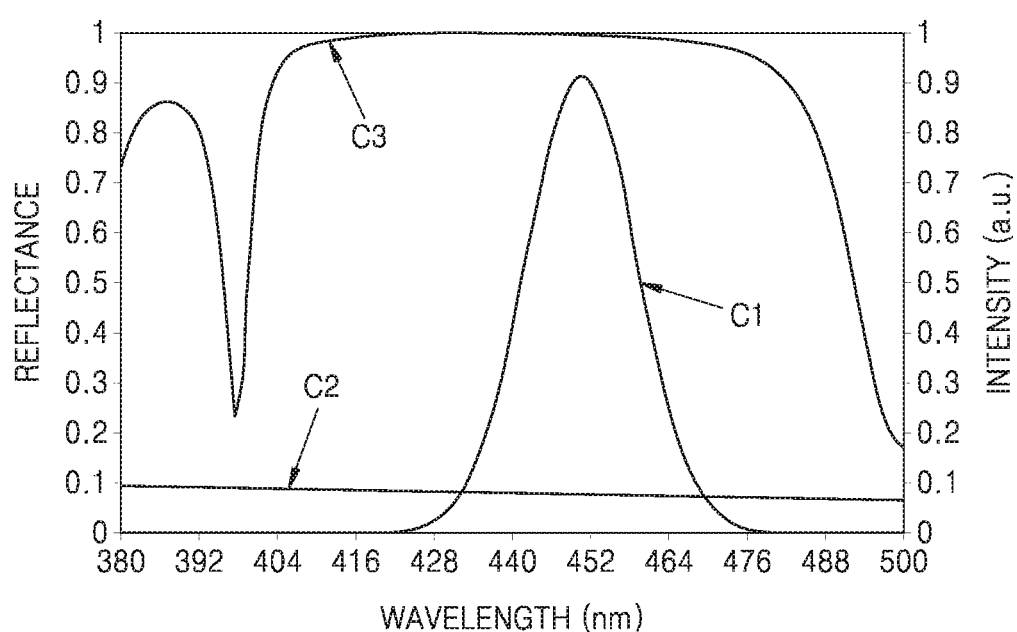
FIG. 11 is a graph showing reflectance according to a material of a current injection limitation layer.

FIG. 11 is a graph showing a reflectance according to a material of a current injection limitation layer. In FIG. 11, "C1" denotes a wavelength of blue light emitted from an active layer. "C2" denotes a reflectance of a $SiO_2$ single layer having a thickness of about 200 nm with respect to the blue light emitted from the active layer. "C3" denotes a reflectance of a multilayer insulating film with respect to the blue light emitted from the active layer. Referring to FIG. 11, it may be seen that, when the current injection limitation layer 738 is formed of a multilayer insulating film, the current injection limitation layer 738 may have a higher reflectance with respect to the blue light B emitted from the active layer 723.

An insulating layer 750 may be provided to cover the second electrodes 732, the TFTs 740, and the current injection limitation layer 738. A light absorbing member 780 may be further provided on a lower surface of the substrate 710. The light absorbing member 780 may prevent the blue light B from being reflected from the lower surface of the substrate 710 and proceeding to an upper portion of the substrate 710 by absorbing the blue light B emitted from the active layer 723 and transmitted through the substrate 710. A etching region 725 for reducing or preventing the current injected from the second electrodes 732 into the second semiconductor layer 722 from flowing sideways may be formed in the second semiconductor layer 722 to a certain depth. The etching region 725 may be formed to surround a contact area between the second semiconductor layer 722 and the second electrodes 732.

FIG. 10 illustrates an example embodiment in which the blue light B is emitted from the active layer 723 provided under the red converting layer 760R and the red light R is emitted from the red converting layer 760R. Referring to FIG. 10, when one of the TFTs 740 corresponding to the red subpixel SR is driven and a certain voltage is applied between the first electrode that is a common electrode and one of the second electrodes 732 corresponding to the red subpixel SR, the blue light B is emitted from the active layer 723 located under the red converting layer 760R. When the blue light B emitted from the active layer 723 is incident on the red converting layer 760R, the red converting layer 760R emits the red light R to the outside.

According to the example embodiment as illustrated in FIG. 10, since the contact area between the second semiconductor layer 722 and the second electrodes 732 is reduced by the current injection limitation layer 738, an emission area of the blue light B emitted from the active layer 723 located under the red converting layer 760R decreases. Accordingly, the emission of light of an undesired color occurring as the blue light B emitted from the active layer 723 located under the red converting layer 760R proceeding to the green converting layer 760G or the blue converting layer 760B may be reduced or prevented. Furthermore, the current injection limitation layer 738 formed of the multilayer insulating film may effectively reduce or prevent the blue light B emitted from the active layer 723 provided under the red converting layer 760R from proceeding to the green converting layer 760G or the blue converting layer 760B.

Since the blue light B emitted from the active layer 723 and transmitted through the substrate 710 may be absorbed by the light absorbing member 780 provided on the lower surface of the substrate 710, the blue light B may be reduced or prevented from being reflected from the lower surface of the substrate 710 and proceeding to the upper portion of the substrate 710. Since the etching region 725 is formed around the contact area between the second semiconductor layer 722 and the second electrodes 732 to a certain depth, the current injected from the second electrodes 732 into the second semiconductor layer 722 may be reduced or prevented from flowing sideways.

Figure 12:
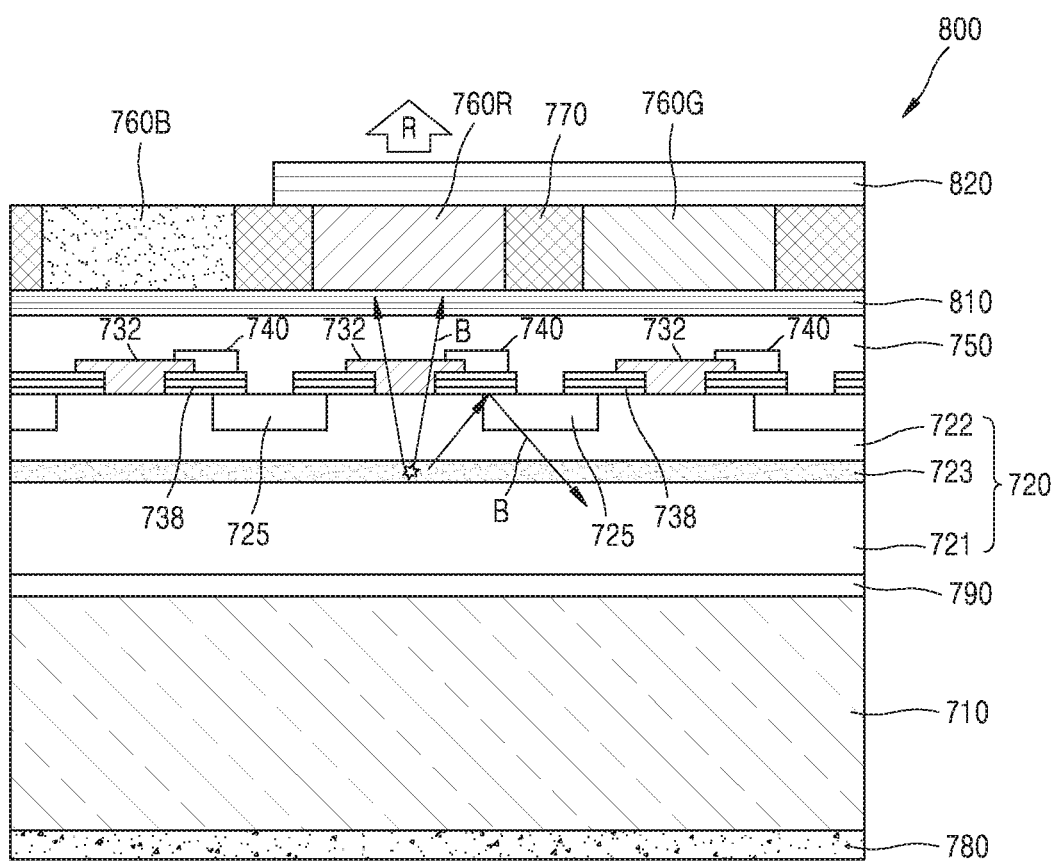
FIG. 12 is a cross-sectional view of a display device according to an example embodiment.

FIG. 12 is a cross-sectional view of a display device 800 according to an example embodiment. The display device 800 of FIG. 12 is substantially the same as the display device 700 of FIG. 10, except that the display device 800 of FIG. 12 includes a selective transparent insulating layer 810 and a selective shield layer 820.

Referring to FIG. 12, the selective transparent insulating layer 810 may be provided between the second electrodes 732 and the color converting layers 760R, 760G, and 760B. The selective transparent insulating layer 810 may transmit the blue light B emitted from the active layer 723 of the emission layer 720 and reflect the light emitted from the color converting layers 760R, 760G, and 760B. The selective transparent insulating layer 810 may have a multilayer structure having different refractive indexes.

The selective shield layer 820 for shielding light of a specific color may be further provided on the color converting layers 760R and 760G. For example, the selective shield layer 820 is provided on the red converting layer 760R and the green converting layer 760G and may include a blue cutoff filter for preventing emission of the blue light B emitted from the active layer 723 to the outside. The selective shield layer 820 may include, for example, resin or a multilayer insulating film.

Figure 13:
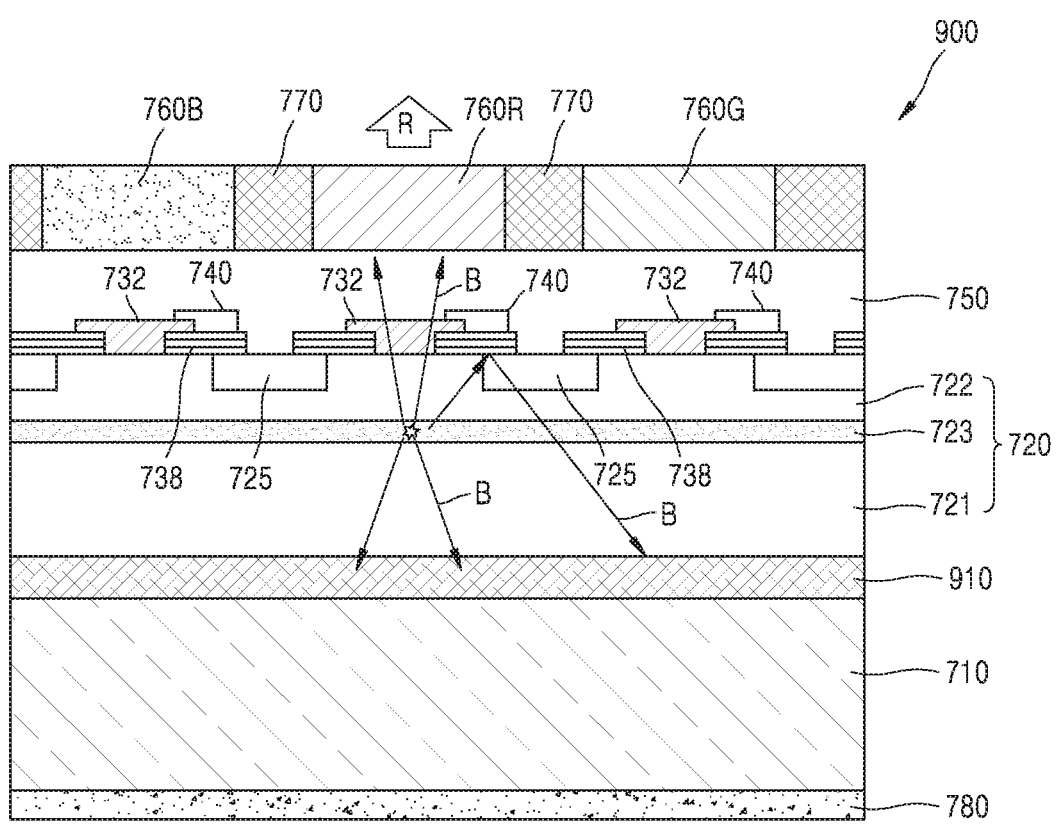
FIG. 13 is a cross-sectional view of a display device according to an example embodiment.

FIG. 13 is a cross-sectional view of a display device 900 according to an example embodiment. The display device 900 of FIG. 13 is substantially the same as the display device 700 of FIG. 10, except that display device 900 of FIG. 13 further includes a light absorbing layer 910.

Referring to FIG. 13, the light absorbing layer 910 may be provided between the substrate 710 and the first semiconductor layer 721. The light absorbing layer 910 may absorb the blue light B emitted from the active layer 723. A selective transparent insulating layer may be further provided between the second electrodes 732 and the color converting layers 760R, 760G, and 760B, and a selective shield layer may be further provided on the color converting layers 760R, 760G, and 760B. Although FIG. 12 illustrates an example embodiment in which the light absorbing layer 910 is provided between the substrate 710 and the first semiconductor layer 721, the light absorbing layer 910 may be provided in the first semiconductor layer 721. An index matching layer 790 may be provided between the substrate 710 and the first semiconductor layer 721. The index matching layer 790 may reduce the amount of the blue light B reflected between the substrate 710 and the first semiconductor layer 721 by using a difference in the refractive index between the substrate 710 and the first semiconductor layer 721.

In the display devices 700, 800, and 900 of FIGS. 10, 12, and 13, the blue light B is emitted from the active layer 723. However, the UV ray may be emitted from the active layer 723.

Figure 14:
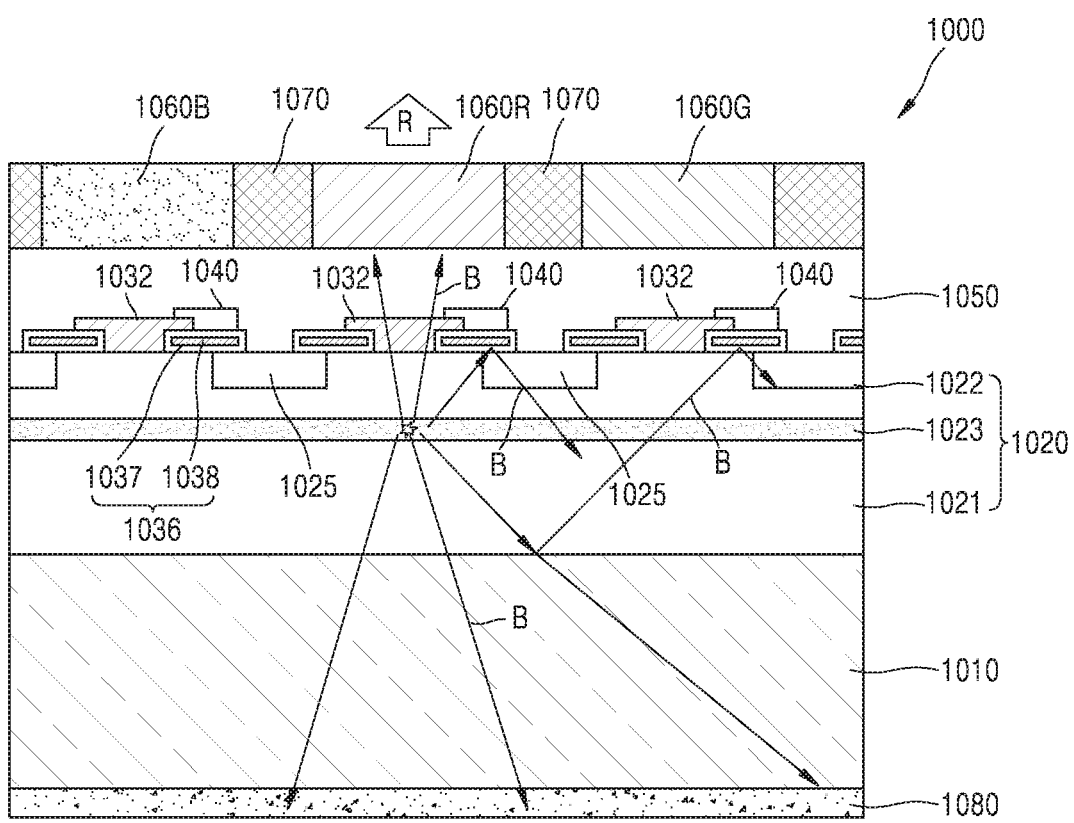
FIG. 14 is a cross-sectional view of a display device according to an example embodiment.

FIG. 14 is a cross-sectional view of a display device 1000 according to an example embodiment. The display device 1000 of FIG. 14 is substantially the same as the display device 300 of FIG. 5, except that a current injection limitation layer 1036 includes an insulating film 1037 and a metal reflection layer 1038.

Referring to FIG. 14, an emission layer 1020 is provided on a substrate 1010, and a plurality of color converting layers 1060R, 1060G, and 1060B are provided above the emission layer 1020. The emission layer 1020 may be formed by sequentially growing a first semiconductor layer 1021, an active layer 1023, and a second semiconductor layer 1022 on upper surface of the substrate 1010.

The first semiconductor layer 1021 may include, for example, n-type semiconductor. For example, the first semiconductor layer 1021 may include III-V group based n-type semiconductor, for example, n-GaN. The active layer 1023 may generate the blue light B as electrons and holes are combined with each other. The active layer 1023 may have, for example, a MQW structure. The second semiconductor layer 1022 may include, for example, p-type semiconductor. For example, the second semiconductor layer 1022 may include III-V group based p-type semiconductor, for example, p-GaN.

A plurality of the color converting layers 1060R, 1060G, and 1060B, that is, a red converting layer 1060R, a green converting layer 1060G, and a blue transmitting layer 1060B, for emitting light of certain colors by the blue light B emitted from the active layer 1023 are provided on the emission layer 1020. The red converting layer 1060R may convert the blue light B emitted from the active layer 1023 to the red light R and emit the red light R. The green converting layer 1060G may convert the blue light B emitted from the active layer 1023 to the green light G and emit the green light G. The blue transmitting layer 1060B may transmit and emit the blue light B emitted from the active layer 1023. A black matrix 1070 for light absorption may be provided between the red converting layer 1060R, the green converting layer 1060G, and the blue transmitting layer 1060B.

The emission layer 1020 may include a first electrode electrically connected to the first semiconductor layer 1021 and a plurality of second electrodes 1032 electrically connected to the second semiconductor layer 1022. The first electrode may serve as a common electrode with respect to the subpixels SR, SG, and SB. The number of the subpixels SR, SG, and SB commonly corresponding to the first electrode may be variously changed. The second electrodes 1032 may be provided on the second semiconductor layer 1022 to have a one-to-one correspondence with the subpixels SR, SG, and SB, that is, the color converting layers 1060R, 1060G, and 1060B. A plurality of TFTs 1040 electrically connected to the second electrodes 1032 is provided on the second semiconductor layer 1022.

The current injection limitation layer 1036 for limiting current injected from the second electrodes 1032 into the second semiconductor layer 1022 may be provided on the second semiconductor layer 1022. The current injection limitation layer 1036 may reduce or prevent emission of light of an undesired color by reducing a contact area between the second semiconductor layer 1022 and the second electrodes 1032.

The current injection limitation layer 1036 may include the insulating film 1037 and the metal reflection layer 1038 provided on the insulating film 1037. The insulating film 1037 may include, for example, $SiO_2$, SiN, $Al_2O_3$, or $TiO_2$, but example embodiments are not limited thereto. The metal reflection layer 1038 may reflect the blue light B emitted from the active layer 1023 and light emitted from the color converting layers 1060R, 1060G, and 1060B. The metal reflection layer 1038 may include, for example, Ag, Al, chromium (Cr), or nickel (Ni).

The metal reflection layer 1038 may include a multilayer structure formed of different materials. For example, the metal reflection layer 1038 may include a first metal layer and a second metal layer provided on the first metal layer and having a reflectance greater than that of the first metal layer. For example, the first metal layer may include a metal material having a relatively low reflectance, such as Cr, Ni, or Ti, and the second metal layer may include a metal material having a relatively high reflectance, such as Ag or Al. As such, when the metal reflection layer 1038 is formed of the first metal layer having a low reflectance and the second metal layer having a high reflectance on the first metal layer, reflection of the light emitted from the active layer 1023 may be reduced by the first metal layer, thereby increasing light loss, and reflection of the light emitted from the color converting layers 1060R, 1060G, and 1060B may be increased by the second metal layer, thereby improving light efficiency.

An insulating layer 1050 may be provided to cover the second electrodes 1032, the TFTs 1040, and the current injection limitation layer 1036. A light absorbing member 1080 may be further provided on a lower surface of the substrate 1010. The light absorbing member 1080 absorbs the blue light B emitted from the active layer 1023 and transmitted through the substrate 1010, and thus, the blue light B may be reduced or prevented from being reflected from the substrate 1010 and proceeding to an upper portion of the substrate 1010. An etching region 1025 for reducing or preventing current injected from the second electrodes 1032 into the second semiconductor layer 1022 from flowing sideways may be formed in the second semiconductor layer 1022 to a certain depth. The etching region 1025 may be formed by etching an area around the contact area between the second semiconductor layer 1022 and the second electrodes 1032 to a certain depth or less.

FIG. 14 illustrates an example embodiment in which the blue light B is emitted from the active layer 1023 provided under the red converting layer 1060R and the red light R is emitted from the red converting layer 1060R. Referring to FIG. 14, when one of the TFTs 1040 corresponding to the red subpixel SR is driven and a certain voltage is applied between the first electrode that is a common electrode and one of the second electrodes 1032 corresponding to the red subpixel SR, the blue light B is emitted from the active layer 1023 located under the red converting layer 1060R. When the blue light B emitted from the active layer 1023 is incident on the red converting layer 1060R, the red converting layer 1060R may emit the red light R to the outside.

According to the example embodiment as illustrated in FIG. 14, since the contact area between the second semiconductor layer 1022 and the second electrodes 1032 is reduced by the current injection limitation layer 1036, an emission area of the blue light B emitted from the active layer 1023 located under the red converting layer 1060R decreases. Accordingly, the emission of light of an undesired color occurring as the blue light B emitted from the active layer 1023 located under the red converting layer 1060R proceeding to the green converting layer 1060G or the blue converting layer 1060B may be reduced or prevented. Furthermore, the current injection limitation layer 1036 formed of the insulating film 1037 and the metal reflection layer 1038 provided on the insulating film 1037 may more effectively reduce or prevent the blue light B emitted from the active layer 1023 provided under the red converting layer 1060R from proceeding to the green converting layer 1060G or the blue converting layer 1060B. Thus, the light emitted from the color converting layers 1060R, 1060G, and 1060B are reflected upward and thus light efficiency may be improved.

The blue light B emitted from the active layer 1023 and transmitted through the substrate 1010 may be absorbed by the light absorbing member 1080 provided on the lower surface of the substrate 1010. Since the etching region 1025 is formed around the contact area between the second semiconductor layer 1022 and the second electrodes 1032 to a certain depth, the current injected from the second electrodes 1032 into the second semiconductor layer 1022 may be reduced or prevented from flowing sideways. In the above description, in the current injection limitation layer 1036, the metal reflection layer 1038 is provided in the insulating film 1037. However, the metal reflection layer 1038 may be provided on an upper surface of the second semiconductor layer 1022, and the insulating film 1037 may be provided to cover the metal reflection layer 1038.

Figure 15:
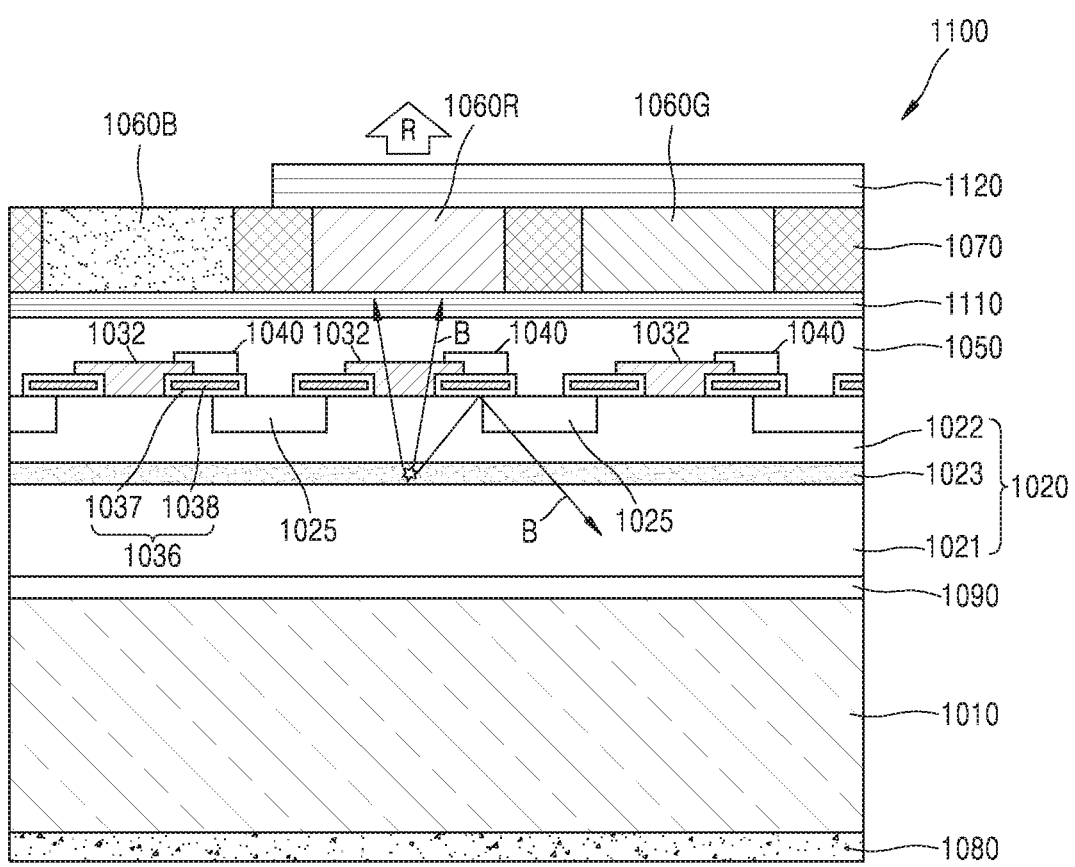
FIG. 15 is a cross-sectional view of a display device according to an example embodiment.

FIG. 15 is a cross-sectional view of a display device 1100 according to an example embodiment. The display device 1100 of FIG. 15 is substantially the same as the display device 1000 of FIG. 14, except that the display device 1100 of FIG. 15 includes a selective transparent insulating layer 1110 and a selective shield layer 1120.

Referring to FIG. 15, the selective transparent insulating layer 1110 may be provided between the second electrodes 1032 and the color converting layers 1060R, 1060G, and 1060B. The selective transparent insulating layer 1110 may transmit the blue light B emitted from the active layer 1023 and reflect the light emitted from the color converting layers 1060R, 1060G, and 1060B. The selective transparent insulating layer 1110 may have a multilayer structure having different refractive indexes.

The selective shield layer 1120 for shielding light of a specific color may be further provided on the color converting layers 1060R and 1060G. For example, the selective shield layer 1120 may be provided on the red converting layer 1060R and the green converting layer 1060G, and may include a blue cutoff filter for preventing emission of the blue light B emitted from the active layer 1023 to the outside. The selective shield layer 1120 may include, for example, resin or a multilayer insulating film.

Figure 16:
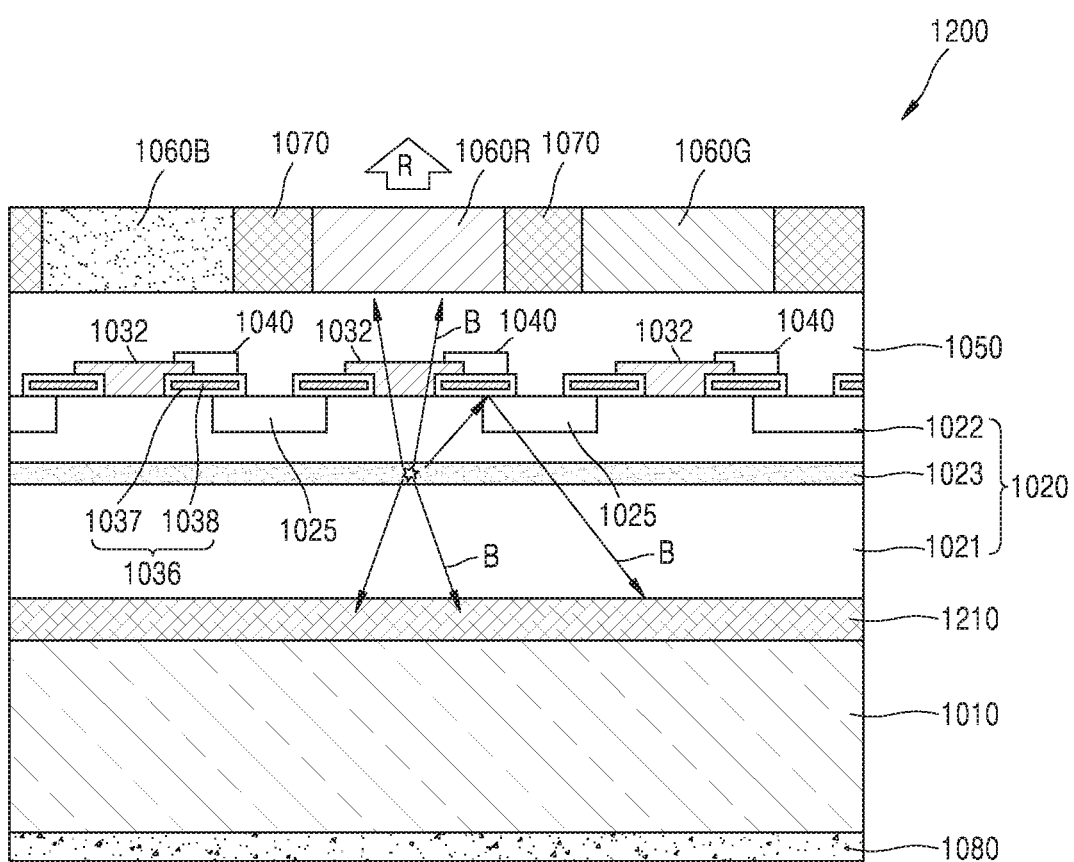
FIG. 16 is a cross-sectional view of a display device according to an example embodiment.

FIG. 16 is a cross-sectional view of a display device 1200 according to an example embodiment. The display device 1200 of FIG. 16 is substantially the same as the display device 1000 of FIG. 14, except that the display device 1200 of FIG. 16 further includes a light absorbing layer 1210.

Referring to FIG. 16, the light absorbing layer 1210 may be provided between the substrate 1010 and the first semiconductor layer 1021. The light absorbing layer 1210 may absorb the blue light B emitted from the active layer 1023. A selective transparent insulating layer may be further provided between the second electrodes 1032 and the color converting layers 1060R, 1060G, and 1060B, and a selective shield layer may be further provided on the color converting layers 1060R, 1060G, and 1060B. Although FIG. 15 illustrates that the light absorbing layer 1210 is provided between the substrate 1010 and the first semiconductor layer 1021, the light absorbing layer 1210 may be provided in the first semiconductor layer 1021. An index matching layer 1090 may be provided between the substrate 1010 and the first semiconductor layer 1021. The index matching layer 1090 may reduce the amount of the blue light B reflected between the substrate 1010 and the first semiconductor layer 1021 by using a difference in the refractive index between the substrate 1010 and the first semiconductor layer 1021.

Figure 17:
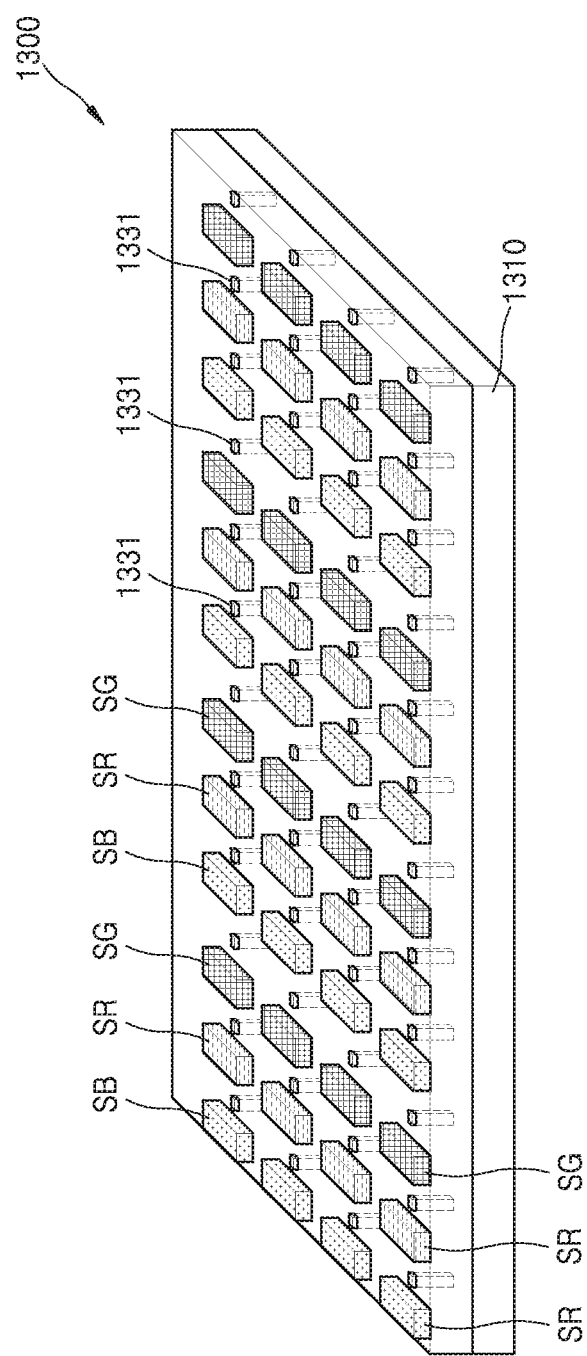
FIG. 17 is a perspective view of a display device according to an example embodiment.

FIG. 17 is a perspective view of a display device 1300 according to an example embodiment. FIG. 17 is a perspective view of the exterior of the display device 1300 to which the structures of the above-described example embodiments are applicable.

Figure 18:
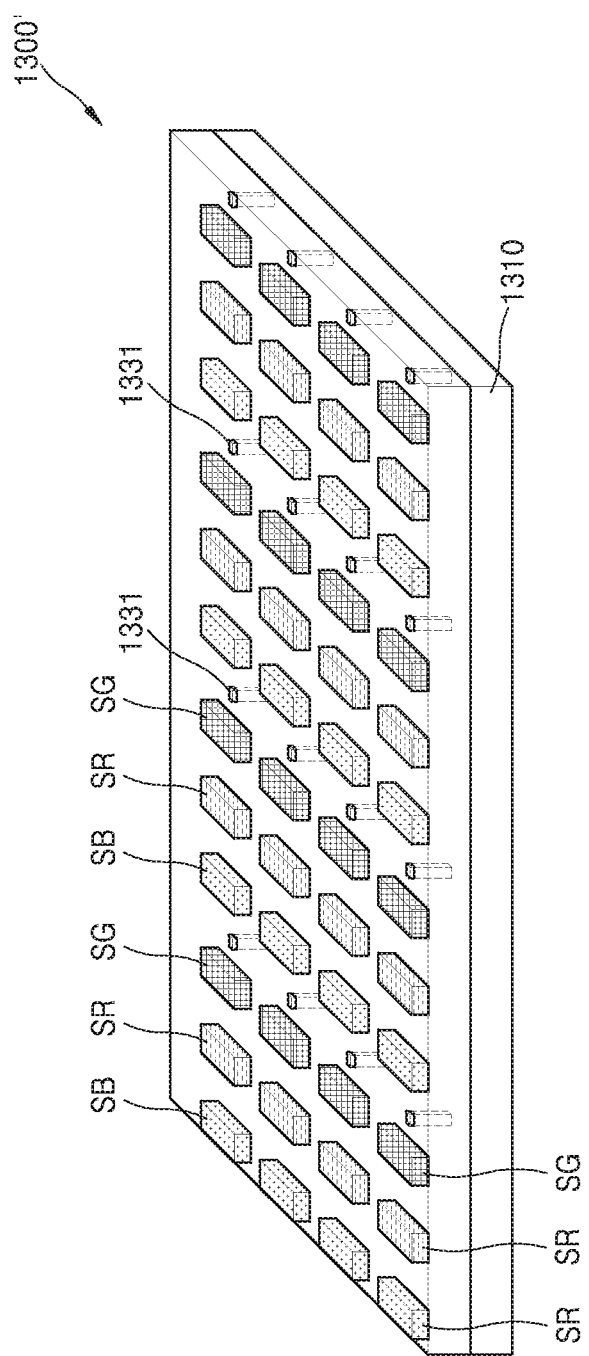
FIG. 18 is a perspective view of a modified example of the display device of FIG. 17.

Referring to FIG. 17, the display device 1300 may include blue, red, and green subpixels SB, SR, and SG arranged in an array on a substrate 1310. At least one common electrode 1331 corresponding to the blue, red, and green subpixels SB, SR, and SG may be provided on the substrate 1310. The common electrode 1331 corresponds to the first electrode (131 of FIG. 1 or 331 of FIG. 4) described in the above-described example embodiments. The common electrode 1331 may be provided to take a relatively very small area compared to the blue, red, and green subpixels SB, SR, and SG. The common electrode 1331 may be, for example, an n-type electrode. Although FIG. 17 illustrates that a single common electrode 1331 is provided to correspond to one of the blue, red, and green subpixels SB, SR, and SG, the single common electrode 1331 may be provided to correspond to a plurality of blue, red, and green subpixels SB, SR, and SG. For example, as illustrated in a display device 1300' of FIG. 18, the single common electrode 1331 may be provided to correspond to three subpixels, for example, the blue, red, and green subpixels SB, SR, and SG. In addition, the number of subpixels corresponding to one common electrode may vary.

FIG. 19 is a plan view of a circuit configuration of the display device of FIG. 17. FIG. 19 illustrates a circuit configuration of one pixel, that is, the blue, red, and green subpixels SB, SR, and SG, and reference numerals 1360B, 1360G, and 1360G denote a blue converting layer (or a blue transmitting layer), a red converting layer, and a green converting layer, respectively, which are described as the color converting layers in the above-described example embodiments.

Referring to FIG. 19, a scan line SL extending in a first direction, and a data line DL and a power line VL extending in a second direction crossing the scan line SL may be provided on a substrate (1310 of FIG. 17). Two transistors TR1 and TR2 and one capacitor CP may be provided to each of the subpixels SB, SR, and SG. In detail, the first transistor TR1 may be provided between the power line VL and the color converting layers 1360B, 1360G, and 1360G, and the second transistor TR2 may be provided on or around an intersection of the scan line SL and the data line DL. Furthermore, the capacitor CP may be provided between the power line VL and the first and second transistors TR1 and TR2. The first transistor TR1, which is the TFT described in the above-described example embodiments, may be a driving transistor, and the second transistor TR2 may be a switching transistor.

In the above structure, when one of the subpixels SB, SR, and SG is driven, the blue light B (or the UV ray) is emitted from the emission layer in the subpixels SB, SR, and SG. When the blue light B (or the UV ray) emitted from the emission layer is incident on the color converting layers 1360B, 1360G, and 1360G in one of the subpixels SB, SR, and SG, light of a certain color is emitted so that an image may be formed.

According to the above example embodiments, since one active layer is formed to correspond to a plurality of color converting layers, an area for exposing the active layer may be reduced, and thus, light efficiency may be improved. Furthermore, since a contact area between a semiconductor layer and an electrode may be reduced by using a current injection limitation layer to reduce an emission area of the active layer, emission of light of an undesired color may be reduced or prevented, and thus, color quality may be improved. Since the current injection limitation layer may be formed in a multilayer insulating film or may include an insulating film and a metal reflection layer provided in the insulating film, the color quality may be further improved. Also, since a portion around the contact area between the semiconductor layer and the electrode may be etched to a certain depth or less, current injected into the semiconductor layer through the electrode may be reduced or prevented from flowing sideways. Furthermore, since the emission layer may be formed directly on the substrate through growth, a conventional process of transferring an LED chip may not be necessary.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:
1. A display device comprising:
a substrate;
an emission layer configured to emit light on the substrate, the emission layer comprising a first semiconductor layer, an active layer provided on the first semiconductor layer, and a second semiconductor layer provided on the active layer;
a color converting layer provided on the emission layer and configured to emit light of predetermined colors from the light emitted from the emission layer to form emission areas for sub-pixels;

a common electrode electrically connected to the first semiconductor layer; and a plurality of electrodes electrically connected to the second semiconductor layer, wherein the active layer is not separated into the emission areas for the sub-pixels, wherein the first semiconductor layer is not separated into the emission areas for the sub-pixels, and wherein the second semiconductor layer is not separated into the emission areas for the sub-pixels.

2. The display device of claim 1, wherein the plurality of electrodes are provided to have a one-to-one correspondence with the sub-pixels.

3. The display device of claim 2, wherein each of the plurality of electrodes is directly connected to a thin film transistor.

4. The display device of claim 1, wherein the first semiconductor layer comprises n-GaN, wherein the second semiconductor layer comprises p-GaN, and wherein the active layer comprises a multi-quantum well (MQW) structure.

5. The display device of claim 1, further comprising a current injection limitation layer configured to limit current injected from the plurality of electrodes into the second semiconductor layer.

6. The display device of claim 1, further comprising a selective transparent insulating layer provided between the emission layer and the color converting layer, and configured to transmit light emitted from the emission layer and to reflect light emitted from the color converting layer.

7. The display device of claim 1, further comprising a selective shield layer provided on the color converting layer and configured to shield light of a predetermined color.

8. The display device of claim 1, further comprising a light absorbing layer provided between the substrate and the emission layer or provided in the emission layer.

9. The display device of claim 1, further comprising an index matching layer provided between the substrate and the emission layer and configured to reduce reflection of light.

10. The display device of claim 9, wherein the index matching layer comprises aluminum nitride (AlN).

11. The display device of claim 1, further comprising a light absorbing member provided on a surface of the substrate opposite to the emission layer.

12. The display device of claim 1, wherein the color converting layer comprises quantum dots (QDs) or phosphor.

13. The display device of claim 1, wherein the emission layer is configured to generate blue light.

14. The display device of claim 13, wherein the color converting layer comprises a red converting layer configured to emit red light by being excited by the blue light, a green converting layer configured to emit green light by being excited by the blue light, and a blue transmitting layer configured to transmit the blue light.

15. The display device of claim 1, wherein the emission layer is configured to generate ultraviolet light.

16. The display device of claim 15, wherein the color converting layer comprises a red converting layer configured to emit red light by being excited by the ultraviolet light, a green converting layer configured to emit green light by being excited by the ultraviolet light, and a blue converting layer configured to emit blue light by being excited by the ultraviolet light.

* * * * *